(12) United States Patent
Kaneda et al.

(10) Patent No.: US 9,119,319 B2
(45) Date of Patent: Aug. 25, 2015

(54) WIRING BOARD, SEMICONDUCTOR DEVICE, AND METHOD FOR MANUFACTURING WIRING BOARD

(71) Applicant: SHINKO ELECTRIC INDUSTRIES CO., LTD., Nagano-shi, Nagano (JP)

(72) Inventors: Wataru Kaneda, Nagano (JP); Noriyoshi Shimizu, Nagano (JP); Akio Rokugawa, Nagano (JP); Kaori Yokota, Nagano (JP)

(73) Assignee: SHINKO ELECTRIC INDUSTRIES CO., LTD., Nagano-Shi (JP)

( * ) Notice: Subject to any disclaimer, the term of this patent is extended or adjusted under 35 U.S.C. 154(b) by 0 days.

(21) Appl. No.: 14/512,754

(22) Filed: Oct. 13, 2014

(65) Prior Publication Data

US 2015/0102510 A1    Apr. 16, 2015

(30) Foreign Application Priority Data

Oct. 15, 2013 (JP) ................................. 2013-214859

(51) Int. Cl.
| | |
|---|---|
| H01L 23/12 | (2006.01) |
| H05K 1/18 | (2006.01) |
| H01L 23/00 | (2006.01) |
| H05K 1/02 | (2006.01) |
| H05K 1/11 | (2006.01) |

(52) U.S. Cl.
CPC *H05K 1/18* (2013.01); *H01L 24/17* (2013.01); *H05K 1/0298* (2013.01); *H05K 1/115* (2013.01); *H01L 2224/16054* (2013.01); *H01L 2224/16225* (2013.01); *H01L 2924/01029* (2013.01)

(58) Field of Classification Search
USPC ................. 257/700, 778, E23.006, E23.011, 257/E23.019; 361/748, 759, 760, 762, 750, 361/751; 174/255, 256, 261, 260, 262
See application file for complete search history.

(56) References Cited

U.S. PATENT DOCUMENTS

| | | | |
|---|---|---|---|
| 6,884,655 B2 * | 4/2005 | Iijima et al. .................... | 438/107 |
| 2005/0218502 A1 * | 10/2005 | Sunohara et al. .............. | 257/700 |
| 2009/0223046 A1 * | 9/2009 | Murayama et al. ............. | 29/847 |
| 2012/0161311 A1 * | 6/2012 | Miyasaka et al. ............. | 257/734 |
| 2013/0062108 A1 * | 3/2013 | Kondo .......................... | 174/258 |

FOREIGN PATENT DOCUMENTS

JP        10-135157        5/1998

* cited by examiner

*Primary Examiner* — Jasmine Clark
(74) *Attorney, Agent, or Firm* — Rankin, Hill & Clark LLP

(57) ABSTRACT

A wiring board includes a first insulating layer containing a thermosetting resin, a first wiring layer stacked on an upper surface of the first insulating layer, a second insulating layer stacked on the upper surface of the first insulating layer, a second wiring layer stacked on an upper surface of the second insulating layer, and a third insulating layer stacked on the upper surface of the second insulating layer. The second and third insulating layers contain a first photosensitive resin. An outer side surface of the second insulating layer is flush with an outer side surface of the first insulating layer. An outer side surface of the third insulating layer is located inside the outer side surface of the second insulating layer in a plan view. The upper surface of the second insulating layer connecting to the outer side surface thereof is exposed from the third insulating layer.

10 Claims, 21 Drawing Sheets

WIRING BOARD, SEMICONDUCTOR DEVICE, AND METHOD FOR MANUFACTURING WIRING BOARD

CROSS-REFERENCE TO RELATED APPLICATION(S)

This application claims priority from Japanese Patent Application No. 2013-214859, filed on Oct. 15, 2013, the entire contents of which are herein incorporated by reference.

BACKGROUND

1. Field

The disclosure relates to a wiring board, a semiconductor device, and a method for manufacturing a wiring board.

2. Related Art

For example, JP H10-135157 A describes a build-up wiring board as a wiring board to be mounted with electronic components such as a semiconductor chip. In the build-up wiring board, plural wiring layers and plural insulating layers are stacked on both of upper and lower surfaces of a core substrate by a build-up method to arrange wiring patterns at higher density.

SUMMARY

According to one aspect of the invention, a wiring board includes a first insulating layer containing a thermosetting resin as a main component, a first wiring layer stacked on an upper surface of the first insulating layer, a second insulating layer stacked on the upper surface of the first insulating layer, a second wiring layer stacked on an upper surface of the second insulating layer, and a third insulating layer stacked on the upper surface of the second insulating layer. The second insulating layer contains a first photosensitive resin as a main component. The second wiring layer electrically connects to the first wiring layer. The third insulating layer contains the first photosensitive resin as a main component. An outer side surface of the second insulating layer is flush with an outer side surface of the first insulating layer. An outer side surface of the third insulating layer is located inside the outer side surface of the second insulating layer in a plan view. The upper surface of the second insulating layer connecting to the outer side surface of the second insulating layer is exposed from the third insulating layer.

The above described aspect of the invention can suppress a plating failure.

DETAILED DESCRIPTION

Figure 1A:
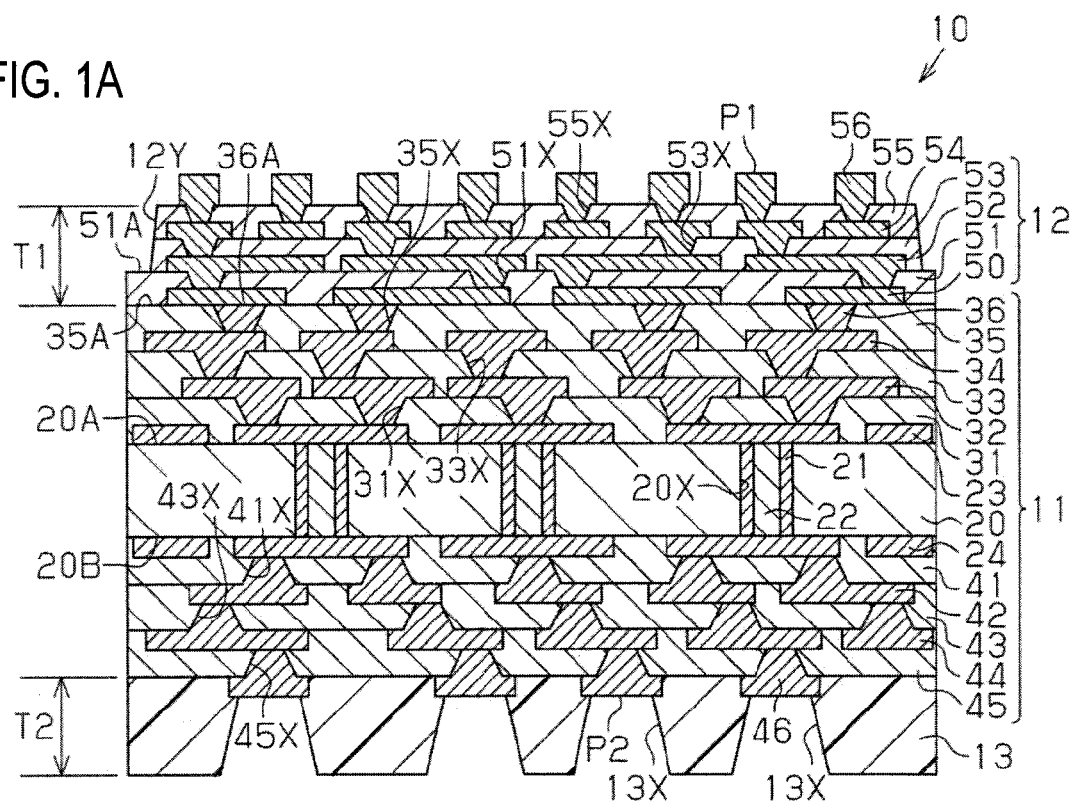
FIG. 1A is a schematic section view of a wiring board according to a first exemplary embodiment of the invention.

Exemplary embodiments will be hereinafter described with reference to the accompanying drawings. In the drawings, for the sake of convenience, that is, to facilitate understanding of a structure, a portion representing the structure may be enlarged. Therefore, for example, a ratio between dimensions of constituent elements drawn in figures need not always be equal to an actual one. In section views, to facilitate understanding of sectional structures of respective members, hatching may be omitted for a part of the members shown.

Comparative Example

At first, a comparative example of a method for manufacturing such a wiring board to be mounted with electronic components such as a semiconductor chip will be described below. In this up wiring board, plural wiring layers and plural insulating layers are stacked on both of upper and lower surfaces of a core substrate by a build-up method.

Figure 24:
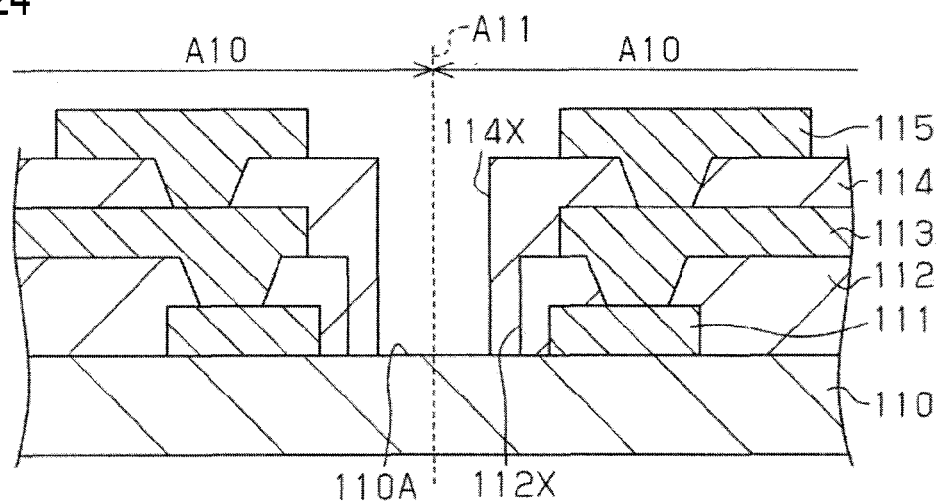
FIG. 24 is a schematic section view of a wiring board of a comparative example.

As shown in FIG. 24, a large-size core substrate 110 is prepared which has many regions A10 in which structural bodies corresponding to respective wiring boards are to be formed. Then, the structural bodies corresponding to the wiring boards are formed in the regions A10 of the core substrate 110, respectively. For example, a structural body in which a wiring layer 111, an insulating layer 112, a wiring layer 113, an insulating layer 114, and a wiring layer 115 are stacked in this order is formed on the core substrate 110. An opening portion 112X is formed in the insulating layer 112 so as to expose a portion of the upper surface 110A of the core substrate 110 at each cutting position A11. Also, an opening 114X is formed in the insulating layer 114 so as to expose a portion of the upper surface 110A of the core substrate 110 at each cutting position A11. Subsequently, a large number of wiring boards are produced at one time by dividing the structural bodies into individual units by cutting the structural bodies at the cutting positions A11 with a dicing blade or the like.

If dicing were to be performed in a state where the insulating layers 112 and 114 are stacked on the core substrate 110 at the cutting positions A11 without the opening portions 112X and 114X being formed, the following would occur. That is, due to stress during the dicing step, peeling would likely occur between the insulating layer 112 and the core substrate 110 and between the insulating layers 112 and 114. To the contrary, in the structure shown in FIG. 24 in which no portions of the insulating layers 112 and 114 are formed at the cutting positions A11 on the core substrate 110. Thus, the structure can suppress peeling between the insulating layer 112 and the core substrate 110 and between the insulating layers 112 and 114 from occurring during the dicing step.

However, through a diligent study, the inventors have found that if the insulating layers 112 and 114 made of a photosensitive resin are formed on the core substrate 110 made of a thermosetting resin containing a filler, the following would occur.

Figure 25A:
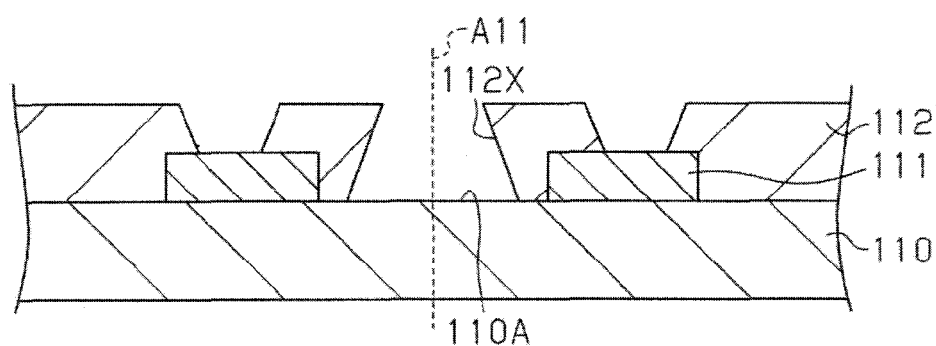
FIGS. 25A and 25B illustrate the wiring board of the comparative example.
Figure 25B:
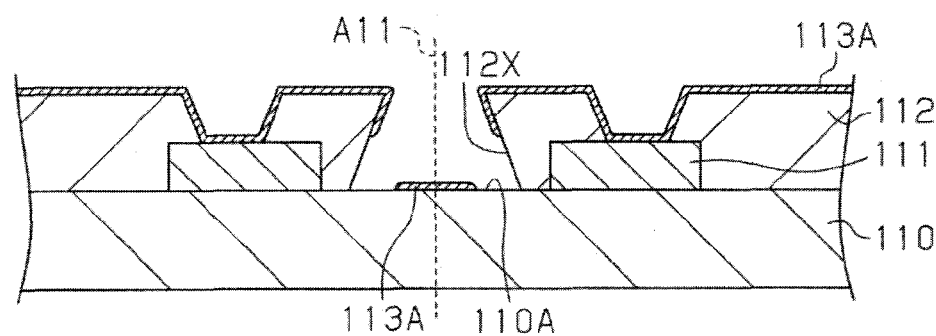

As shown in FIG. 25A, the insulating layer 112 is formed on the core substrate 110 so as to cover the insulating layer 111. Then, exposure and development are performed for the insulating layer 112 by means of the photolithography method so as to form the opening portion 112X in the insulating layer 112. As a result, as shown in FIG. 25A, the opening portion 112X is formed so as to have an inverted taper shape whose diameter decreases from a lower side (a bottom portion of the opening portion 112X; a core substrate 110 side) toward an upper side. This is considered because, for example, exposure light is diffusely reflected by surfaces of filler particles that are exposed from an upper surface 110A of the core substrate 110. When sputtering is performed to form a seed layer 113A on the entire surface of the structural body shown in FIG. 25A, the opening portions 112X having the inverted taper shape causes that as shown in FIG. 25B, the seed layer 113A cannot be formed so as to cover the entire inner side surfaces of the opening portion 112X. That is, it is difficult to form the seed layer 113A that continuously covers (i) the upper surface of the insulating layer 112, (ii) the inner side surfaces of the opening portion 112X having the inverted taper shape, and (iii) a portion, exposed to the bottom portion of the opening portion 112X, of the upper surface 110A of the core substrate 110. If a wiring layer 113 is formed by electrolytic plating in which the seed layer 113A is used as a plating power supply layer, failure would occurs in power supply which result in such plating failure that a plating layer is not formed properly.

Some of exemplary embodiments described below are made to suppress the plating failure.

First Exemplary Embodiment

A first exemplary embodiment will be described below with reference to FIGS. 1A to 18.

As shown in FIG. 1A, a wiring board 10 has a wiring structure 11, a wiring structure 12, and a solder resist layer 13. The wiring structure 12 is stacked on one side (upper side) of the wiring structure 11. The solder resist layer 13 is stacked on the other side (lower side) of the wiring structure 11. The wiring board 10 may have any plan-view shape and size. For example, the wiring board 10 may have a square plan-view shape measuring about 40 mm by 40 mm.

Description will be given on the configuration of the wiring structure 11.

The wiring structure 11 is a low-density wiring structure in which wiring layers are formed at lower densities than in the wiring structure 12. A core substrate 20 is provided at an approximate center portion, in a thickness direction, of the wiring structure 11. For example, the core substrate 20 may be a so-called glass epoxy substrate. The glass epoxy substrate may be obtained by (i) impregnating a glass cloth (glass woven fabric), serving as a reinforcement member, with a thermosetting insulating resin containing an epoxy resin as a main component and (ii) then setting the thermosetting insulating resin. The reinforcement member is not limited to the glass cloth. Examples of the reinforcement member include a glass nonwoven fabric, an aramid woven fabric, an aramid nonwoven fabric, a liquid crystal polymer (LCP) woven fabric, and an LCP nonwoven fabric. Also, the thermosetting insulating resin is not limited to the epoxy resin. Examples of the thermosetting resin include a resin material such as a polyimide resin and a cyanate resin. A thickness of the core substrate 20 may be, for example, in a range of about 200 to 1,000 μm.

Through holes 20X are provided in the core substrate 20 at prescribed positions (in FIG. 1A, three positions). The through holes 20X penetrate through the core substrate 20 from an upper surface 20A and a lower surface 20B. Although not shown in drawings, each through hole 20X may be formed in an approximately circular shape in a plan view. The thorough holes 20X may have, for example, about 100 to 500 µm in diameter. The through holes 20X may be arranged, for example, at a pitch of about 200 to 1,000 µm.

A through electrode 21 is formed on an inner side surface of each through hole 20X so as to penetrate through the core substrate 20 in the thickness direction. A central part of each through hole 20X (that is, a portion of each through hole 20X which is located inside the through electrode 21) is filled with a resin 22. Examples of a material of the through electrodes 21 include copper (Cu) and a copper alloy. Examples of a material of the resin 22 include an insulating resin such as an epoxy resin.

A wiring layer 23 is formed on the upper surface 20A of the core substrate 20. A wiring layer 24 is formed on the lower surface 20B of the core substrate 20. The wiring layers 23 and 24 electrically connect to each other through the through electrodes 21. Examples of materials of the wiring layers 23 and 24 include copper and a copper alloy. The wiring layers 23 and 24 may have, for example, about 15 to 35 µm in thickness. The wiring layers 23 and 24 may have, for example, about 20 µm/20 µm in line/space (L/S).

An insulating layer 31, a wiring layer 32, an insulating layer 33, a wiring layer 34, an insulating layer 35, and via wirings 36 are further stacked in this order on the upper surface 20A of the core substrate 20. Examples of materials of the insulating layers 31, 33, and 35 include a thermosetting insulating resin containing, as a main component, an insulating resin such as an epoxy resin and a polyimide resin. The insulating layers 31, 33, and 35 may contain a filler made of silica ($SiO_2$), alumina ($Al_2O_3$), or the like. Examples of materials of the wiring layers 32 and 34 and the via wirings 36 include copper and a copper alloy. The insulating layers 31, 33, and 35 may have, for example, about 20 to 45 µm in thickness. Examples of the wiring layers 32 and 34 may have, for example, about 15 to 35 µm in thickness. The wiring layers 32 and 34 may have, for example, about 20 µm/20 µm in line/space (L/S).

The insulating layer 31 is formed on the upper surface 20A of the core substrate 20 so as to cover the wiring layer 23. Through holes 31X are formed at prescribed positions in the insulating layer 31. The through holes 31X penetrate through the insulating layer 31 in the thickness direction. Portions of an upper surface of the wiring layer 23 are exposed through the through holes 31X. Each through hole 31X is formed in a taper shape so that a diameter of each through hole 31X increases from a lower side (core substrate 20 side) to an upper side (wiring structure 12 side) in FIG. 1A. That is, each through hole 31X is formed in a taper shape so that the diameter of each through hole 31X increases from the lower side (a bottom portion of each through hole 31X) to the upper side. For example, each through hole 31X is formed in an inverted cone frustum shape so that an upper opening end of each through hole 31X has a larger diameter than a lower opening end thereof. The upper opening end of each through hole 31X may have, for example, about 60 to 70 µm in diameter.

The wiring layer 32 is stacked on an upper surface of the insulating layer 31. The wiring layer 32 electrically connects to the wiring layer 23. The wiring layer 32 has via wirings and a wiring pattern. The via wirings fill the through holes 31X. The wiring pattern is formed on the upper surface of the insulating layer 31.

The insulating layer 33 is formed on the upper surface of the insulating layer 31 so as to cover the wiring layer 32. Through holes 33X are formed at prescribed positions in the insulating layer 33. The through holes 33X penetrate through the insulating layer 33 in the thickness direction. Portions of an upper surface of the wiring layer 32 are exposed through the through holes 33X. Each through hole 33X is formed in a taper shape so that a diameter of each through hole 33X increases from the lower side to the upper side in FIG. 1A. For example, each through hole 33X is formed in an inverted cone frustum shape so that an upper opening end of each through hole 33X has a larger diameter than a lower opening end thereof. The upper opening end of each through hole 33X may have, for example, about 60 to 70 µm in diameter.

The wiring layer 34 is stacked on an upper surface of the insulating layer 33. The wiring layer 34 electrically connects to the wiring layer 32. The wiring layer 34 has via wirings and a wiring pattern. The via wirings fill the through holes 33X. The wiring pattern is formed on the upper surface of the insulating layer 33.

The insulating layer 35 is formed on the upper surface of the insulating layer 33 so as to cover the wiring layer 34. Through holes 35X open on an upper surface 35A of the insulating layer 35 at prescribed positions. The through holes 35X penetrate through the insulating layer 35 in the thickness direction. Portions of an upper surface of the wiring layer 34 are exposed through the through holes 35X. Each through hole 35X is formed in a taper shape so that a diameter of each through hole 35X increases from the lower side to the upper side in FIG. 1A. For example, each through hole 35X is formed in an inverted cone frustum shape so that an upper opening end of each through hole 35X has a larger diameter than a lower opening end thereof. The upper opening end of each through hole 35X may have, for example, about 60 to 70 µm in diameter.

Figure 1B:
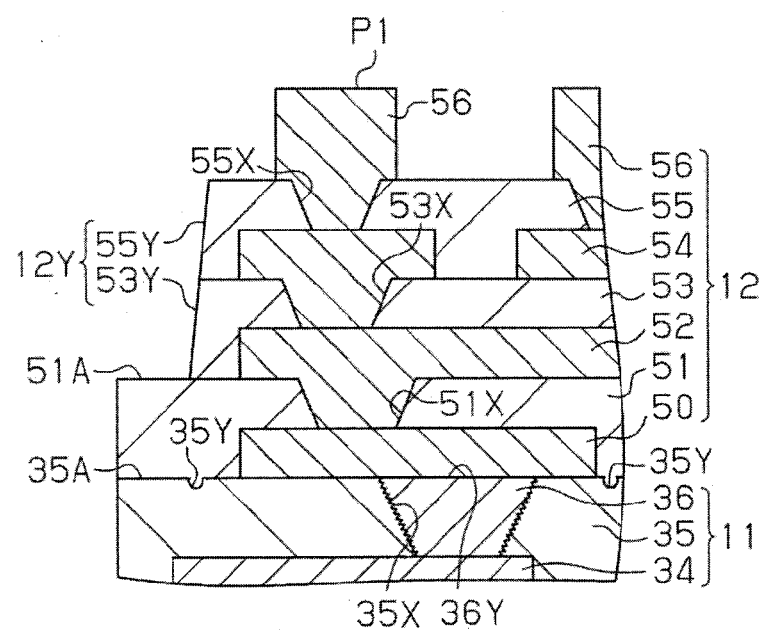
FIG. 1B is an enlarged section view of a part of the wiring board shown in FIG. 1A.

As shown in FIG. 1B, the upper surface 35A of the insulating layer 35 is a smooth surface (low roughness surface) having very small asperities. For example, the upper surface 35A of the insulating layer 35 is lower in surface roughness than the inner side surfaces of the through holes 35X. However, the upper surface 35A of the insulating layer 35 is formed with many minute recess portions 35Y. Each recess portion 35Y may have any plan-view shape and sectional shape. For example, each recess portion 35Y may have an approximately circular shape in a plan view and an approximately semicircular shape in section. In this case, each recess portion 35Y may have, for example, about 0.1 to 2 µm in diameter. Also, each recess portion 35Y may have, for example, about 0.1 to 2 µm in depth.

The roughness of the upper surface 35A of the insulating layer 35 is, for example, in a range of about 15 to 40 nm in terms of surface roughness Ra. The roughness of the inner side surfaces of the through holes 35X is, for example, in a range of about 300 to 400 nm in terms of surface roughness Ra. The term "surface roughness Ra" is a value representing surface roughness and is also called arithmetic mean roughness. More specifically, the surface roughness Ra is calculated by measuring, with respect to an average line (surface), absolute values of heights that vary in a measurement region and averaging the measured absolute values arithmetically.

The via wirings 36 are formed in the through holes 35X. The via wirings 36 electrically connect the wiring layer 34 and a wiring layer 50 formed on the upper surface 35A of the insulating layer 35. The via wirings 36 penetrate through the insulating layer 35 in the thickness direction. As shown in FIG. 1A, like the through holes 35X, each via wiring 36 is formed in a taper shape so that a diameter of each via wiring 36 increases from the lower side (wiring layer 34 side) to the upper side (wiring layer 50 side). For example, each via wiring 36 has an inverted cone frustum shape so that an upper end surface 36A of each via wiring 36 has a larger diameter than a lower end surface thereof. The upper end surfaces 36A of the via wirings 36 are exposed from the insulating layer 35. For example, the upper end surfaces 36A of the via wirings 36 are approximately flush with the upper surface 35A of the insulating layer 35. The upper end surfaces 36A of the via wirings 36 are directly connected to the wiring layer 50. The upper end surface 36A of each via wiring 36 may have, for example, 60 to 70 µm in diameter. Examples of a material of the via wirings 36 include copper and a copper alloy.

As shown in FIG. 1A, an insulating layer 41, a wiring layer 42, an insulating layer 43, a wiring layer 44, an insulating layer 45, and a wiring layer 46 are further stacked in this order on the lower surface 20B of the core substrate 20. Examples of materials of the insulating layers 41, 43, and 45 include a thermosetting insulating resin containing, as a main component, an insulating resin such as an epoxy resin and a polyimide resin. The insulating layers 41, 43, and 45 may contain a filler made of silica, alumina, or the like. Examples of materials of the wiring layers 42, 44, and 46 include copper and a copper alloy. The insulating layers 41, 43, and 45 may have, for example, about 20 to 45 µm in thickness. The wiring layers 42, 44, and 46 may have, for example, about 15 to 35 µm in thickness. The wiring layers 42, 44, and 46 may have, for example, about 20 µm/20 µm in line/space (L/S).

The insulating layer 41 is formed on the lower surface 20B of the core substrate 20 so as to cover the wiring layer 24. Through holes 41X are formed at prescribed positions in the insulating layer 41. The through holes 41X penetrate through the insulating layer 41. Portions of a lower surface of the wiring layer 24 are exposed through the through holes 41X. Each through hole 41X is formed in a taper shape so that a diameter of each through hole 41X increases from the upper side (core substrate 20 side) to the lower side (solder resist layer 13 side). For example, each through hole 41X is formed in a cone frustum shape so that a lower opening end of each through hole 41X has a larger diameter than an upper opening end thereof. The lower opening end of each through hole 41X may have, for example, about 60 to 70 µm in diameter.

The wiring layer 42 is stacked on a lower surface of the insulating layer 41. The wiring layer 42 electrically connects to the wiring layer 24. The wiring layer 42 has via wirings and a wiring pattern. The via wirings fill the through holes 41X. The wiring pattern is formed on the lower surface of the insulating layer 41.

The insulating layer 43 is formed on the lower surface of the insulating layer 41 so as to cover the wiring layer 42. Through holes 43X are formed at prescribed positions in the insulating layer 43. The through holes 43X penetrate through the insulating layer 43 in the thickness direction. Portions of a lower surface of the wiring layer 42 are exposed through the through holes 43X. As shown in FIG. 1A, each through hole 43X is formed in a taper shape so that a diameter of each through hole 43X increases from the upper side to the lower side. For example, each through hole 43X is formed in a cone frustum shape so that a lower opening end of each through hole 43X has a larger diameter than an upper opening end thereof. The lower opening end of each through hole 43X may have, for example, about 60 to 70 µm in diameter.

The wiring layer 44 is stacked on the lower surface of the insulating layer 43. The wiring layer 44 electrically connects to the wiring layer 42. The wiring layer 44 has via wirings and a wiring pattern. The via wirings fill the through holes 43X. The wiring pattern is formed on the lower surface of the insulating layer 43.

The insulating layer 45 is formed on the lower surface of the insulating layer 43 so as to cover the wiring layer 44. Through holes 45X are formed at prescribed positions in the insulating layer 45. The through holes 45X penetrate through the insulating layer 45 in the thickness direction. Portions of a lower surface of the wiring layer 44 are exposed through the through holes 45X. As shown in FIG. 1A, each through hole 45X is formed in a taper shape so that a diameter of each through hole 45X increases from the upper side to the lower side. For example, each through hole 45X is formed in a cone frustum shape so that a lower opening end of each through hole 45X has a larger diameter than an upper opening end thereof. The lower opening end of each through hole 45X may have, for example, 60 to 70 µm in diameter.

The wiring layer 46 is stacked on a lower surface of the insulating layer 45. The wiring layer 46 electrically connects to the wiring layer 44. The wiring layer 46 has via wirings and a wiring pattern. The via wirings fill the through holes 45X. The wiring pattern is formed on the lower surface of the insulating layer 45.

As described above, in the wiring structure 11, the number of wiring layers stacked on the upper side of the core substrate 20 is equal to the number of wiring layers stacked on the lower side of the core substrate 20. Also, the number of insulating layers stacked on the upper side of the core substrate 20 is equal to the number of insulating layers stacked on the lower side of the core substrate 20. That is, in the wiring structure 11, the wiring layers and the insulating layers are formed approximately up-down symmetrically with respect to the core substrate 20. As such, the wiring structure 11 is resistant to warping. In particular, if the insulating layers have the same thickness, the wiring structure 11 has a well balanced structure in the up and down directions, which leads to more resistance to warping.

In this exemplary embodiment, the three insulating layers 31, 33, and 35 are formed on the upper surface 20A of the core substrate 20, and the three insulating layers 41, 43, and 45 are formed on the lower surface 20B of the core substrate 20. However, the invention is not limited thereto. The number of insulating layers formed on each of the upper and lower surfaces 20A, 20B of the core substrate 20 may be a number other than three. Also, the four wiring layers (wiring layers 23, 32, and 34 and via wirings 36) are formed on the upper surface 20A of the core substrate 20, and the four wiring layers 24, 42, 44, and 46 are formed on the lower surface 20B of the core substrate 20. However, the invention is not limited thereto. The number of wiring layers formed on each of the upper and lower surfaces 20A, 20B of the core substrate 20 may be a number other than four.

Next, description will be given on the configuration of the wiring structure 12.

The wiring structure 12 is a high-density wiring structure in which wiring layers are formed at higher densities than in the wiring structure 11. The wiring structure 12 is configured so that the wiring layer 50, an insulating layer 51, a wiring layer 52, an insulating layer 53, a wiring layer 54, an insulating layer 55, and a wiring layer 56 are stacked in this order. The wiring layer 50 is stacked on the insulating layer 35. A thickness T1 of the wiring structure 12 may be, for example, in a range of about 20 to 40 µm. The thickness T1 of the wiring structure 12 is a total thickness of all the insulating layers 51, 53, and 55 of the wiring structure 12. In other words, the thickness T1 of the wiring structure 12 is a thickness from the upper surface 35A of the insulating layer 35 to an upper surface of the insulating layer 55.

Examples of materials of the wiring layers 50, 52, 54, and 56 include copper and a copper alloy. Also, examples of materials of the insulating layers 51, 53, and 55 include a photosensitive insulating resin containing, as a main component, a phenol resin or a polyimide resin. The insulating layers 51, 53, and 55 may contain a filler made of silica, alumina, or the like.

The wiring layers 50, 52, 54, and 56 are thinner than the wiring layers of the wiring structure 11. The wiring layers 50, 52, and 54 may have, for example, about 1 to 3 μm in thickness. The wiring layer 56 may have, for example, about 10 to 15 μm in thickness. The wiring layers 50, 52, and 54 may have, for example, about 2 μm/2 μm in line/space (L/S). The insulating layers 51, 53, and 55 are thinner than the insulating layers of the wiring structure 11. The insulating layers 51, 53, and 55 may have, for example, about 5 to 10 μm in thickness.

The wiring layer 50 is stacked on the upper surface 35A of the insulating layer 35. The wiring layer 50 is connected to the upper end surfaces 36A of the via wirings 36. That is, portions of the lower surface of the wiring layer 50 are in contact with the upper end surfaces 36A of the via wirings 36, so that the wiring layer 50 electrically connect to the via wirings 36. In other words, while the wiring layer 50 electrically connects to the via wirings 36, the wiring layer 50 is not integral with the via wirings 36. More specifically, for example, the wiring layer 50 has (i) a seed layer (e.g., a laminate body of a titanium (Ti) layer and a copper (Cu) layer) formed on the upper end surfaces 36A of the via wirings 36 and (ii) a metal layer (e.g., a copper (Cu) layer) formed on the seed layer.

The insulating layer 51 is formed on the upper surface 35A of the insulating layer 35 so as to cover the wiring layer 50. The insulating layer 51 is formed so as to cover the entire surfaces of portions, not covered by the wiring layer 50, of the upper surface 35A of the insulating layer 35. Through holes 51X are formed at prescribed positions in the insulating layer 51. The through holes 51X penetrate through the insulating layer 51 in the thickness direction. Portions of an upper surface of the wiring layer 50 are exposed through the through holes 51X. As shown in FIG. 1A, each through hole 51X is formed in a taper shape so that a diameter of each through hole 51X increases from the lower side (wiring structure 11 side) to the upper side (wiring layer 56 side). For example, each through hole 51X has an inverted cone frustum shape so that an upper opening end of each through hole 51X has a larger diameter than a lower opening end thereof. The upper opening end of each through hole 51X may have, for example, about 10 to 20 μm in diameter.

As shown in FIG. 1B, the insulating layer 51 is formed so as to fill the recess portions 35Y of the insulating layer 35. Also, outer side surfaces of the insulating layer 51 are approximately flush with outside surfaces of the insulating layer 35. Furthermore, the outer side surfaces of the insulating layer 51 are approximately flush with outside surfaces of all the insulating layers 31, 33, 35, 41, 43, and 45 of the wiring structure 11.

The wiring layer 52 is stacked on an upper surface 51A of the insulating layer 51. The wiring layer 52 electrically connects to the wiring layer 50. The wiring layer 52 has via wirings and a wiring pattern. The via wirings fill the through holes 51X. The wiring pattern is formed on the upper surface 51A of the insulating layer 51.

The insulating layer 53 is formed on the upper surface 51A of the insulating layer 51 so as to cover the wiring layer 52. Through holes 53X are formed at prescribed positions in the insulating layer 53. The through holes 53X penetrate through the insulating layer 53 in the thickness direction. Portions of an upper surface of the wiring layer 52 are exposed through the through holes 53X. Each through hole 53X is formed in a taper shape so that a diameter of each through hole 53X increases from the lower side to the upper side in FIG. 1B. For example, each through hole 53X has an inverted cone frustum shape so that an upper opening end of each through hole 53X has a larger diameter than a lower opening end thereof. The upper opening end of each through hole 53X may have, for example, about 10 to 20 μm in diameter.

Outer side surfaces of the insulating layer 53 are located inside the outer side surfaces of the insulating layer 51 in a plan view. Specifically, an opening portion 53Y is formed in the insulating layer 53 and near an outer periphery of the insulating layer 51. The opening portion 53Y penetrates through the insulating layer 53 in the thickness direction. A portion of the upper surface 51A of the insulating layer 51 is exposed through the opening portion 53Y.

Figure 2:
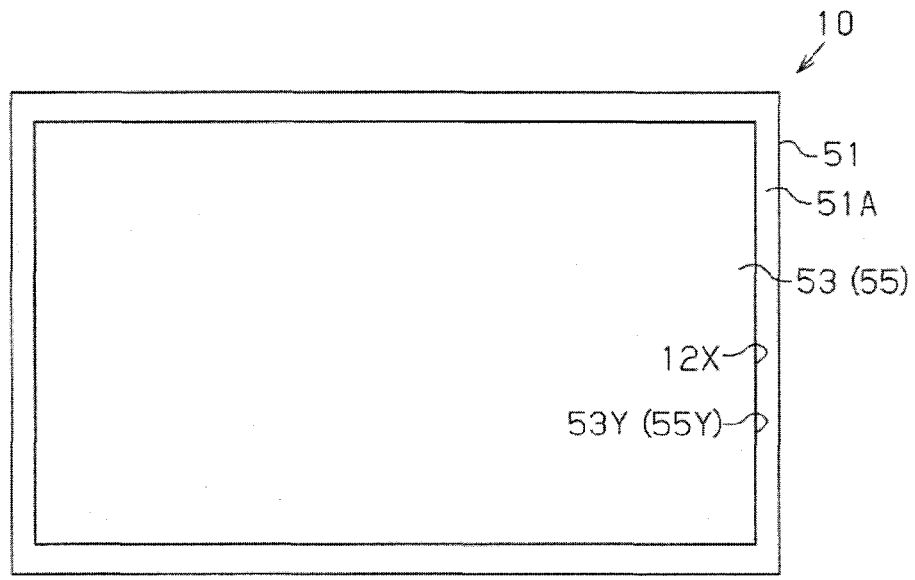
FIG. 2 is a schematic plan view showing an insulating layer containing a photosensitive resin as a main component, with omitting a wiring layer.

In other words, as shown in FIG. 2, the insulating layer 53 overlaps the insulating layer 51 in a plan view. Also, the insulating layer 53 has smaller external dimensions in a plan view than the insulating layer 51. Thus, the opening portion 53Y is formed, for example, in an annular shape along the outer periphery of the wiring board 10. The external dimensions of the insulating layer 53 are equal to, for example, about 80% to 95% of the external dimensions of the insulating layer 51.

As shown in FIG. 1B, the outer side surfaces of the insulating layer 53 are, for example, inclined surfaces. In this exemplary embodiment, the outer side surfaces of the insulating layer 53 are inclined so as to go away from the outer side surfaces of the insulating layer 51, toward the upper side in FIG. 1B (that is, a distance between (i) each outer side surface of the insulating layer 53 and (ii) a virtual line extending along the corresponding outer side surface of the insulating layer 51 increases from the lower side to the upper side). That is, the outer side surfaces of the insulating layer 53 are inclined downward from the outer periphery of the upper surface of the insulating layer 53 toward the outer periphery of the insulating layer 51.

The wiring layer 54 is stacked on an upper surface of the insulating layer 53. The wiring layer 54 electrically connects to the wiring layer 52. The wiring layer 54 has via wirings and a wiring pattern. The via wirings fill the through holes 53X. The wiring pattern is formed on the upper surface of the insulating layer 53.

The insulating layer 55 is formed on the upper surface of the insulating layer 53 so as to cover the wiring layer 54. Through holes 55X are formed at prescribed positions in the insulating layer 55. The through holes 55X penetrate through the insulating layer 55 in the thickness direction. Portions of an upper surface of the wiring layer 54 are exposed through the through holes 55X. Each through hole 55X is formed in a taper shape so that a diameter of each through hole 55X increases from the lower side to the upper side in FIG. 1B. For example, each through hole 55X has an inverted cone frustum shape so that an upper opening end of each through hole 55X has a larger diameter than a lower opening end thereof. The upper opening end of each through hole 55X may have, for example, about 10 to 20 μm in diameter.

Like the outer side surfaces of the insulating layer 53, outer side surfaces of the insulating layer 55 are located inside the outer side surfaces of the insulating layer 51 in a plan view. Specifically, an opening portion 55Y is formed in the insulating layer 55 and near the outer periphery of the insulating layer 51. The opening portion 55Y penetrates through the insulating layer 55 in the thickness direction. Portions of the upper surface 51A of the insulating layer 51 are exposed through the opening portions 55Y.

In other words, as shown in FIG. 2, the insulating layer 55 overlaps the insulating layer 51 in a plan view. Also, the insulating layer 55 has smaller external dimensions in a plan view than the insulating layer 51. Thus, for example, the opening portion 55Y is formed, for example, in an annular shape along the outer periphery of the wiring board 10. The external dimensions of the insulating layer 55 are equal to, for example, about 80% to 95% of the external dimensions of the insulating layer 51.

As shown in FIG. 1B, the outer side surfaces of the insulating layer 55 are, for example, inclined surfaces. In this exemplary embodiment, the outer side surfaces of the insulating layer 55 are inclined so as to go away from the outer side surfaces of the insulating layer 51, toward the upper side in FIG. 1B (that is, a distance between (i) each outside surface of the insulating layer 53 and (ii) the virtual line extending along the corresponding outer side surface of the insulating layer 51 increases from the lower side to the upper side). That is, the outer side surfaces of the insulating layer 55 are inclined downward from the outer periphery of the upper surface of the upper surface of the insulating layer 55 toward the outer periphery of the insulating layer 51.

As described above, the outer side surfaces of the insulating layers 53 and 55 are located inside the outer side surfaces of the insulating layer 51 in a plan view (the opening portions 53Y and 55Y are formed). Therefore, the upper surface 51A near the outer periphery of the insulating layer 51 are exposed from the insulating layers 53 and 55. Since the opening portions 53Y and 55Y are formed, a cut-out portion 12Y is formed at an outer periphery of the wiring structure 12. Specifically, the outer side surfaces of the insulating layers 53 and 55 and the upper surface 51A of the insulating layer 51 constitute the cut-out portion 12Y.

The wiring layer 56 is stacked on the upper surface of the insulating layer 55. The wiring layer 56 electrically connects to the wiring layer 54. The wiring layer 56 has via wirings and pads P1. The via wirings fill the through holes 55X. The pads P1 project from the upper surface of the insulating layer 55. Each pad P1 may have any shape and any size in a plan view. Each pad P1 may have, for example, a circular shape, in a plan view, having about 20 to 30 μm in diameter. The pads P1 may be arranged, for example, at a pitch of about 40 to 50 μm. The pads P1 function as pads for mounting electric components on the wiring board 10. The pads P1 are, for example, to be electrically connected to electric components such as a semiconductor chip.

If necessary, a surface treatment layer may be formed on a surface(s) of each pad P1 (for example, an upper surface and side surfaces of each pad P1 or only the upper surface of each pad P1). Examples of the surface treatment layer include a gold (Au) layer, a nickel (Ni)/Au layer (i.e., a metal layer formed by stacking an Ni layer and an Au layer in this order), and an Ni/palladium (Pd)/Au layer (i.e., a metal layer formed by stacking an Ni layer, a Pd layer, and an Au layer in this order). For example, the Ni layer, Au layer, and Pd layer may be metal layers formed by electroless plating (electrolessly plated metal layers). The Ni layer is a metal layer made of Ni or an Ni alloy. The Au layer is a metal layer made of Au or an Au alloy. The Pd layer is a metal layer made of Pd or a Pd alloy. A surface treatment layer may be formed by performing anti-oxidation treatment such as OSP (organic solderability preservative) treatment on the surface(s) of each pad P1 (for example, the upper surface and side surfaces of each pad P1 or only the upper surface of each pad P1).

On the other hand, the solder resist layer 13 is the outermost layer (in FIG. 1A, the lowest layer) formed on the lower surface of the wiring structure 11. The solder resist layer 13 is formed on the lower surface of the insulating layer 45 which is the lowest insulating layer in the wiring structure 11. The solder resist layer 13 covers the wiring layer 46 which is the lowest layer of the wiring structure 11.

Opening portions 13X are formed in the solder resist layer 13. Portions of the lowest wiring layer 46 are exposed through the opening portions 13X, to serve as external connection pads P2. The external connection pads P2 are configured so that external connection terminals such as solder balls or lead pins for mounting the wiring board 10 on a mother board or the like can be connected to the external connection pads P2. If necessary, a surface treatment layer may be formed on each portion, exposed through the opening portion 13X, of the wiring layer 46. Examples of the surface treatment layer include an Au layer, an Ni/Au layer (i.e., a metal layer formed by stacking an Ni layer and an Au layer in this order), and an Ni/Pd/Au layer (i.e., a metal layer formed by stacking an Ni layer, a Pd layer, and an Au layer in this order). For example, the Ni layer, Au layer, and Pd layer may be metal layers formed by electroless plating (electrolessly plated metal layer). A surface treatment layer may be formed by performing anti-oxidation treatment such as OSP treatment on a lower surface of each external connection pad P2. The portions, exposed through the opening portions 13X, of the wiring layer 46 (or the surface treatment layers if the surface treatment layers are formed on the wiring layer 46) may be used as external connection electrodes, as they are.

Each opening portion 13X and each external connection pad P2 may have any shapes and sizes in a plan view. Each opening portion 13X may have, for example, a circular shape, in a plan view, having about 200 to 300 μm in diameter. Also, each external connection pad P2 may have, for example, a circular shape, in a plan view, having about 200 to 300 μm in diameter. Examples of a material of the solder resist layer 13 include a photosensitive insulating resin containing, as a main component, a phenol resin, a polyimide resin, or the like. The solder resist layer 13 may contain, for example, a filler made of silica, alumina, or the like.

A thickness T2 of the solder resist layer 13 (that is, the thickness T2 from the lower surface of the insulating layer 45 to a lower surface of the solder resist layer 13) is equal to or larger than the thickness T1 of the wiring structure 12. For example, where the thickness T1 of the wiring structure 12 is 30 μm, the thickness T2 of the solder resist layer 13 may be in a range of 30 to 50 μm. More specifically, it is preferable that a ratio (T1/T2) of the thickness T1 of the wiring structure 12 to the thickness T2 of the solder resist layer 13 be equal to or smaller than 1. It is more preferable that the ratio T1/T2 be equal to or smaller than 0.75. The solder resist layer 13 having such a thickness relationship can reduce an amount of a warp of the wiring board 10.

In the wiring board 10, it is preferable that the core substrate 20 has about 30 GPa in elasticity modulus and that about 10 ppm/° C. in thermal expansion coefficient. It is preferable that the insulating layers 31, 33, 35, 41, 43, and 45 containing a thermosetting resin as a main component have about 5 to 15 GPa in elastic modulus and about 10 to 40 ppm/° C. in thermal expansion coefficient. It is also preferable that the insulating layers 51, 53, and 55 containing a photosensitive resin as a main component have about 5 GPa in elastic modulus and about 50 to 70 ppm/° C. in thermal expansion coefficient. Furthermore, it is preferable that the solder resist layer 13 containing a photosensitive resin as a main component has about 2 to 4 GPa in elastic modulus and about 40 to 50 ppm/° C. in thermal expansion coefficient.

The thermal expansion coefficient of each insulating layer may be adjusted to a prescribed value by changing the filler content. However, the amount of filler that can be contained in each insulating layer whose main component is a photosensitive resin has an upper limit. This is because an excessively large filler content makes it difficult to perform proper exposure for the insulating layers. Therefore, there is such a tendency that the thermal expansion coefficients of the insulating layers containing a photosensitive resin as a main component are larger than those of the insulating layers containing a thermosetting resin as a main component. Examples of a material of the filler include silica, alumina, kaolin ($Al_2Si_2O_5(OH)_4$) and talc ($Mg_3Si_4O_{10}(OH_2)$). The filler may be a mixture of some of these exemplary materials.

If the above-described values of the material properties (elasticity modulus and thermal expansion coefficient), the wiring board 10 become softer gradually from the core substrate 20 towards outer layers. As a result, in synergy with the above-described relationship between the thickness of the solder resist layer 13 and the thickness of the wiring structure 12, the degree of warping of the wiring board 10 is suppressed.

Next, description will be made on the configuration of a semiconductor device 60.

Figure 3:
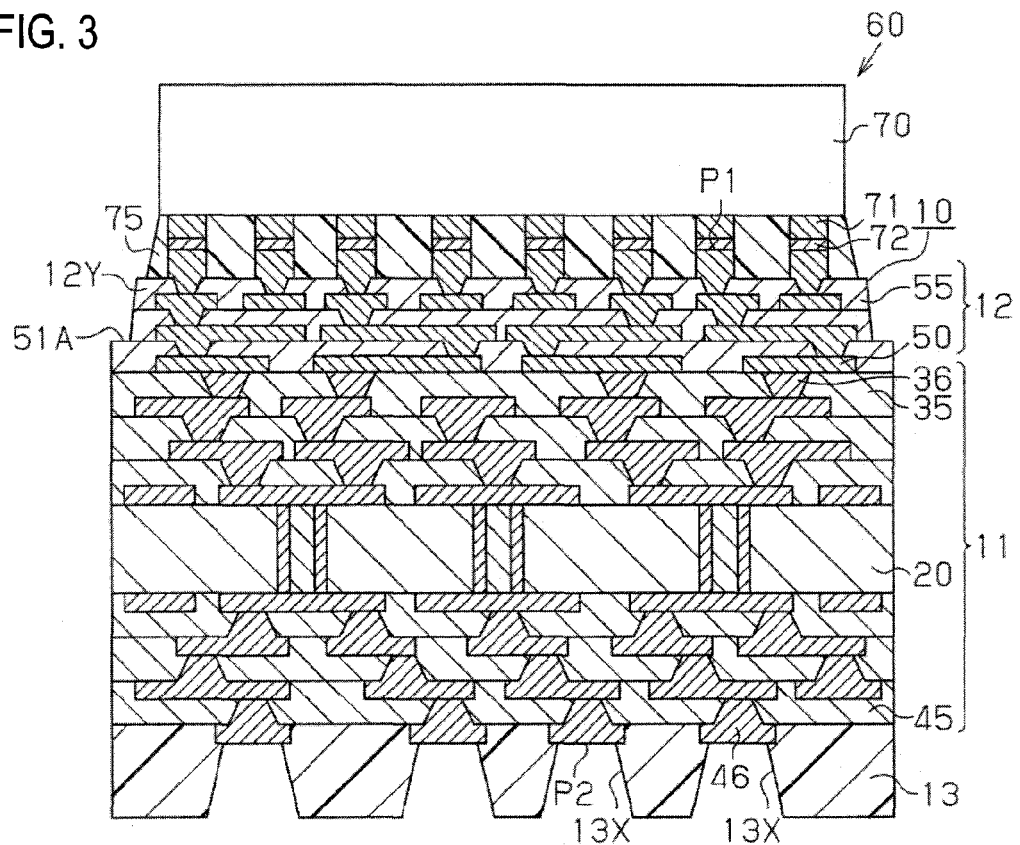
FIG. 3 is a schematic section view of a semiconductor device according to the first exemplary embodiment.

As show in FIG. 3, the semiconductor device 60 has the above-described wiring board 10, one or more semiconductor chips 70, and an underfill resin 75.

The semiconductor chip 70 is flip-chip-mounted on the wiring board 10. Specifically, connection terminals 71 are provided on a circuit formation surface (in FIG. 3, lower surface) of the semiconductor chip 70. The connection terminals 71 are joined to the pads P1 of the wiring board 10 via joining members 72. Thereby, the semiconductor chip 70 electrically connects to the pads P1 (wiring layer 56) via the connection terminals 71 and the joining members 72.

The semiconductor chip 70 may be a logic chip such as a CPU (central processing unit) chip or a GPU (graphics processing unit) chip. Also the semiconductor chip 70 may be a memory chip such as a DRAM (dynamic random access memory) chip, an SRAM (static random access memory) chip, or a flash memory chip. Where the wiring board 10 is mounted with plural semiconductor chips 70, the semiconductor chips 70 may be a combination of a logic chip(s) and a memory chip(s). For example, as a CPU chip and a DRAM chip may be mounted on the wiring board 10. Also, a GPU chip and a DRAM chip may be mounted on the wiring board 10.

A size of the semiconductor chip 70 may be, for example, in a range of about 3 mm by 3 mm to about 12 mm by 12 mm in a plan view. The semiconductor chip 70 may have, for example, about 50 to 100 μm in thickness.

The connection terminals 71 may be, for example, metal posts. The connection terminals 71 may have a columnar shape and extend downward from the circuit formation surface of the semiconductor chip 70. In this exemplary embodiment, the connection terminals 71 may have a cylindrical shape. The connection terminals 71 may have, for example, about 10 to 20 μm in height. Each connection terminal 71 may have, for example, about 20 to 30 μm in diameter. The connection terminals 71 may be arranged, for example, at a pitch of about 40 to 50 μm. Examples of a material of the connection terminals 71 include copper and a copper alloy. The connection terminals 71 may be gold bumps rather than metal posts.

The joining members 72 are joined to the pads P1 and the connection terminals 71. Examples of the joining members 72 include tin (Sn) layers and solder plating layers of lead (Pb)-free solder. Examples of a material of the solder plating layers include Sn-silver (Ag)-based Pb-free solder, Sn—Cu-based Pb-free solder, and Sn—Ag—Cu-based Pb-free solder. The joining members 72 may have, for example, about 5 to 15 μm in thickness.

The underfill resin 75 is provided so as to fill a space between the wiring board 10 and the semiconductor chip 70. Examples of a material of the underfill resin 75 include an insulating resin such as an epoxy resin.

Next, description will be made on a method for manufacturing the above-described wiring board 10. The following description will be directed to a so-called multi-piece method for manufacturing a number of wiring boards by producing together plural units which will become respective wiring boards and then separating the plural units into individual units.

Figure 4A:
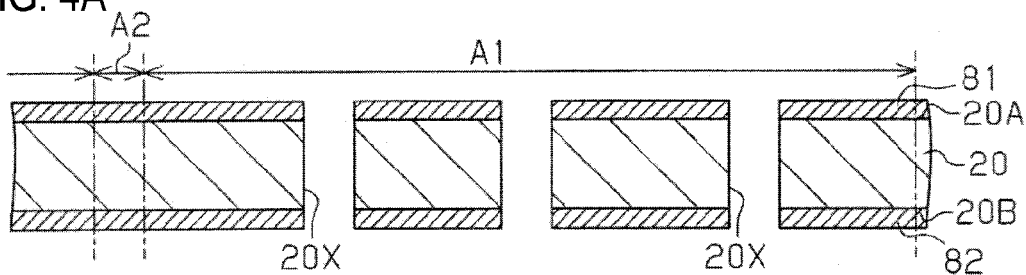
FIGS. 4A to 4D are a set of schematic section views showing a method for manufacturing the wiring board according to the first exemplary embodiment.

First, in a step shown in FIG. 4A, a base member is prepared. In the base member, a flat metal foil 81 is formed on the upper surface 20A of the core substrate 20 and flat metal foil 82 is formed on the lower surface 20B of the core substrate 20. The base member (core substrate 20) is a large-size substrate from which a number of wiring board 10 can be produced. More specifically, the base member (core substrate 20) has plural regions A1 in each of which a structural body corresponding to a wiring board 10 is to be formed. After the structural bodies corresponding to the wiring boards 10 are formed in the regions A1, the core substrate 20 will be cut in cutting regions A2 by a dicing blade or the like. As a result, the structural bodies corresponding to the respective wiring boards 10 will be separated into the individual wiring board 10. The metal foils 81 and 82 may be copper foils having, for example, about 10 to 20 μm in thickness.

Subsequently, the plural through holes 20X are formed in the base member (core substrate 20). The through holes 20X may be formed, for example, by drilling.

Figure 4B:
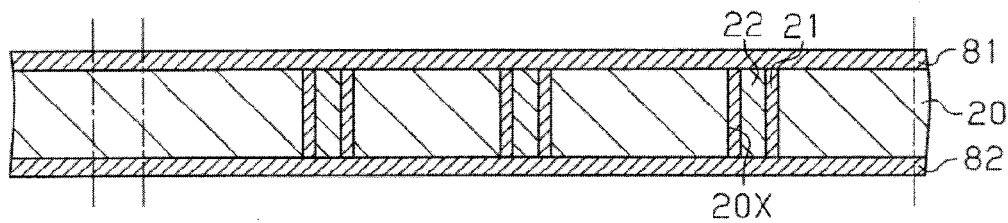

In a step shown in FIG. 4B, the through electrodes 21 are formed on the inner side surfaces of the through holes 20X by, for example, electroless plating using copper or the like. Then, the resin 22 is formed by filling an insulating resin, such as an epoxy resin, into the center portions of the through holes 20X where the through electrodes 21 are formed. Also, copper patterns are formed on upper end surfaces and lower end surfaces of the through electrodes 21 and resin members 22 by, for example, electroless plating. In FIG. 4B, the copper patterns formed on the upper and lower end surfaces of the through electrodes 21 and resin members 22 are not discriminated from the metal foils around the copper patterns. Therefore, the copper patterns and the metal foils are drawn together as the flat metal foils 81 and 82.

Figure 4C:
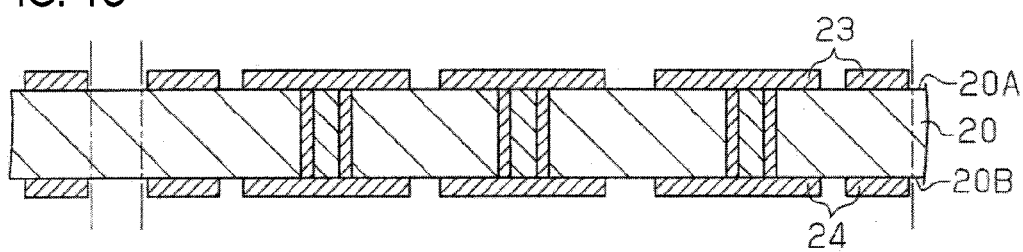

In a step shown in FIG. 4C, the flat metal foils 81 and 82 are patterned. Thereby, the wiring layer 23 is formed on the upper surface 20A of the core substrate, and the wiring layer 24 is formed on the lower surface 20B of the core substrate 20. The wiring layers 23 and 24 may be formed by, for example, the subtractive process.

Figure 4D:
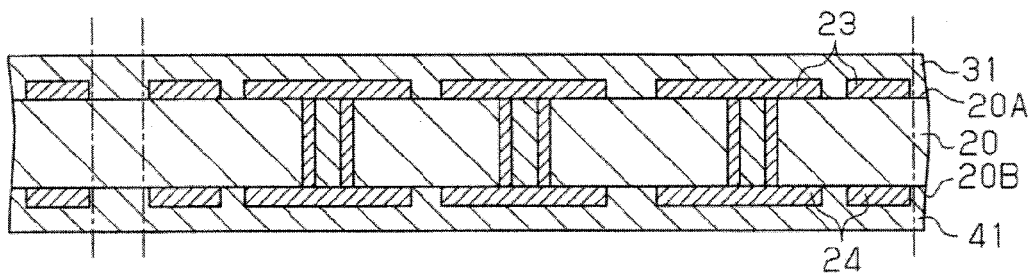

In a step shown in FIG. 4D, the insulating layer 31 is formed so as to the upper surface 20A of the core substrate 20 and the wiring layer 23. Also, an insulating layer 41 is formed so as to cover the lower surface 20B of the core substrate 20 and the wiring layer 24. Resin films may be used as the insulating layers 31 and 41. In this case, the resin films are, for example, laminated on the upper and lower surfaces 20A, 20B of the core substrate 20. Then, the resin films are set by performing heat treatment at a temperature (e.g., about 130°

C. to 200° C.) that is higher than a setting temperature of the resin films while pressing the resin films. Thereby, the insulating layers 31 and 41 are formed. In this case, laminating the resin films in a vacuum atmosphere can prevent involvement of voids. Examples of the resin films include a thermosetting resin film containing an epoxy resin as a main component. Alternatively, a liquid or paste-like insulating resin may be used as the insulating layers 31 and 41. In this case, the liquid or past-like insulating resin is applied to the upper and lower surfaces 20A, 20B of the core substrate 20, for example, by spin coating. Then, the applied insulating resin is set by performing heat treatment at a temperature that is higher than a setting temperature of the applied insulating resin. Thereby, the insulating layers 31 and 41 are formed. Examples of the liquid or past-like insulating resin include a thermosetting resin containing an epoxy resin as a main component.

Figure 5A:
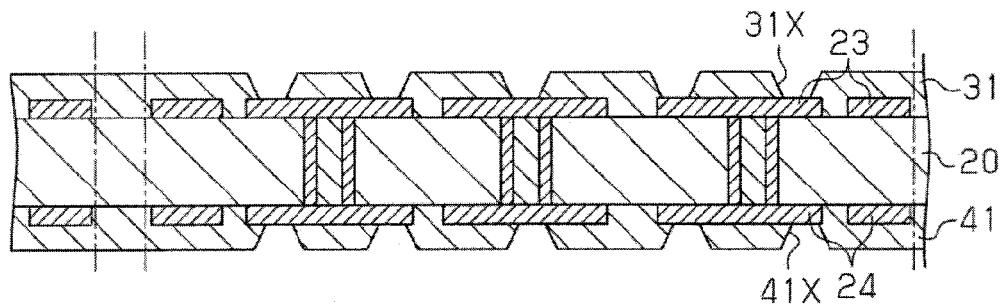
FIGS. 5A to 5C are a set of schematic section views showing the method for manufacturing the wiring board according to the first exemplary embodiment.

In a step shown in FIG. 5A, the through holes 31X are formed in the insulating layer 31 at the prescribed positions. The portions of the upper surface of the wiring layer 23 are exposed through the through holes 31X. Also, the through holes 41X are formed in the insulating layer 41 at the prescribed positions. The portions of the lower surface of the wiring layer 24 are exposed through the through holes 41X. The through holes 31X and 41X may be formed, for example, by laser processing using a $CO_2$ laser or a UV-YAG laser. Where the through holes 31X and 41X are formed by the laser processing, desmearing is performed to remove resin smears adhering to portions, exposed to lower portions of the through holes 31X and 41X, of the surfaces of the wiring layers 23 and 24.

Figure 5B:
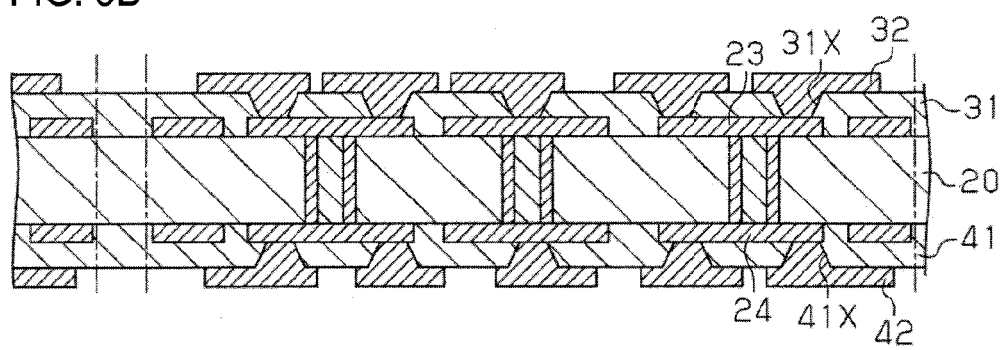

Subsequently, in a step shown in FIG. 5B, the wiring layer 32 is formed. The wiring layer 32 includes the via wirings and the wiring pattern. The via wirings of the wiring layer 32 fill the through holes 31X of the insulating layer 31. The wiring pattern of the wiring layer 32 is stacked on the upper surface of the insulating layer 31 and electrically connects to the wiring layer 23 via the via wirings of the wiring layer 32. Also, the wiring layer 42 is formed. The wiring layer 42 includes the via wirings and the wiring pattern. The via wirings of the wiring layer 42 fill the through holes 41X of the insulating layer 41. The wiring pattern of the wiring layer 42 is stacked on the lower surface of the insulating layer 41 and electrically connects to the wiring layer 24 via the via wirings of the wiring layer 42. The wiring layers 32 and 42 may be formed, for example, by any of various wiring forming methods such as a semi-additive process and a subtractive process.

Next, steps similar to those shown in FIGS. 4D to 5B are executed again. As a result, as shown in FIG. 5C, the insulating layer 33 and the wiring layer 34 are stacked on the upper surface 20A side of the core substrate 20, and the insulating layer 43 and the wiring layer 44 are stacked on the lower surface 20B side of the core substrate.

Figure 5C:
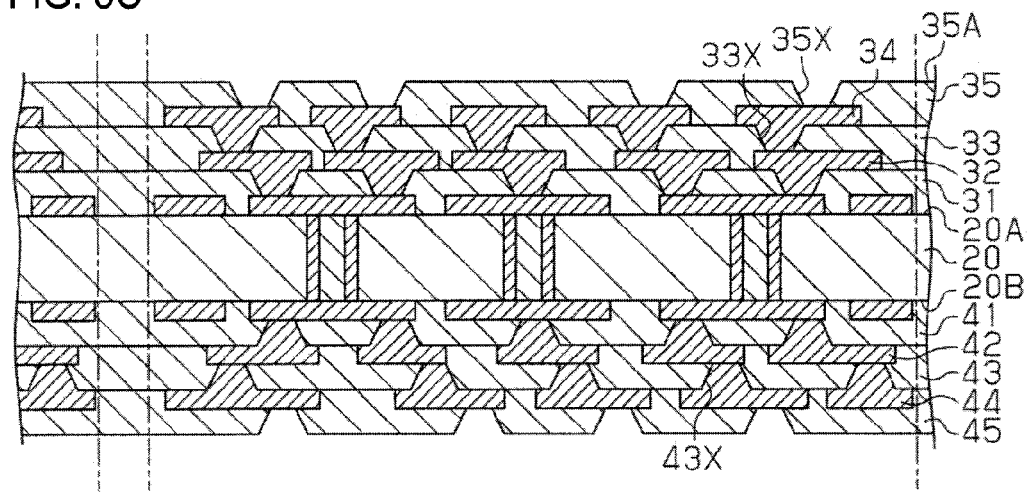

In a step shown in FIG. 5C, steps similar to those shown in FIGS. 4D and 5A are also executed again. Thereby, the insulating layer 35 formed with the through holes 35X is stacked on the upper surface of the insulating layer 33, and the insulating layer 45 formed with the through holes 45X is stacked on the lower surface of the insulating layer 43.

Where the through holes 35X and 45X are formed by the laser processing, desmearing is performed to remove resin smears adhering to (i) portions, exposed to lower portions of the through holes 35X, of the surface of the wiring layer 34 and (ii) portions, exposed to upper portions of the through holes 45X, of the surface of the wiring layer 44. As a result of the desmearing, the inner side surfaces of the through holes 35X, the upper surface 35A of the insulating layer 35, the inner side surfaces of the through holes 45X, and the lower surface of the insulating layer 45 are roughened.

Figure 6A:
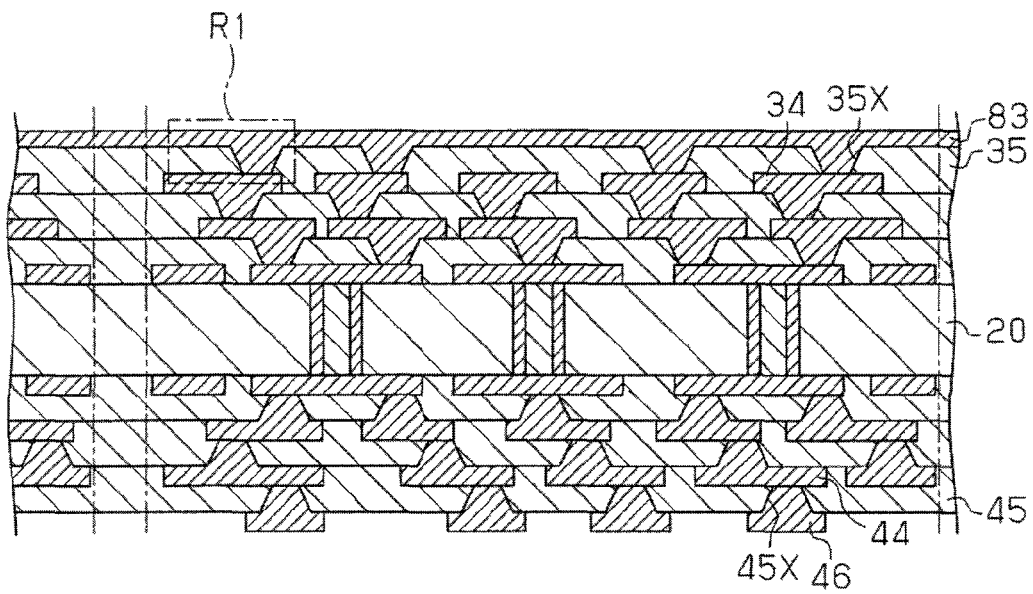
FIG. 6A is a schematic section view showing the method for manufacturing the wiring board according to the first exemplary embodiment.

Next, in a step shown in FIG. 6A, the wiring layer 46 is formed. The wiring layer 46 includes the via wirings and the wiring pattern. The via wirings of the wiring layer 46 fill the through holes 41X of the insulating layer 41. The wiring pattern of the wiring layer is stacked on the lower surface of the insulating layer 45 and electrically connects to the wiring layer 44 via the via wirings of the wiring layer 46. The wiring layer 46 may be formed, for example, by any of various wiring forming methods such as a semi-additive process and a subtractive process.

Figure 6B:
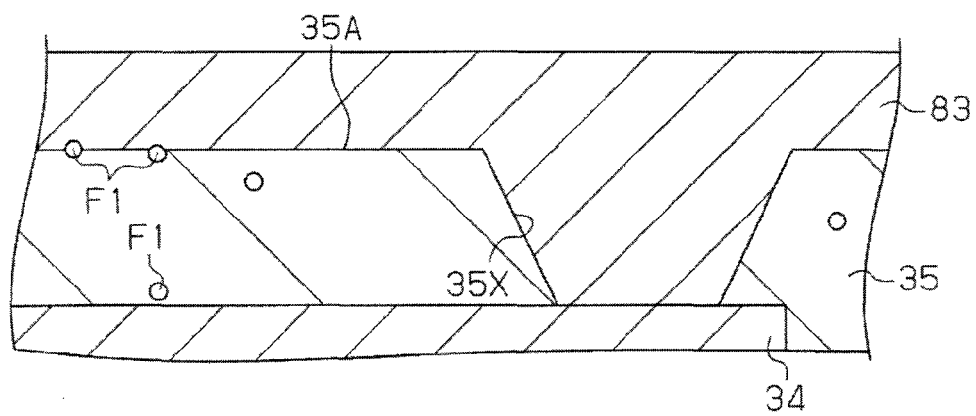
FIG. 6B is an enlarged section view of a region R1 of FIG. 6A.

Also, in the step shown in FIG. 6A, a seed layer (not shown) is formed so as to cover the entire surface of the insulating layer 35 including the inner surfaces of the through holes 35X. Then, electrolytic plating (panel plating) is performing using the seed layer as an electricity supply layer. For example, the seed layer is formed so as to cover the entire surface of the insulating layer 35 by electroless copper plating. Then, the electrolytic copper plating is performed using the seed layer as an electricity supply layer. Thereby, a conductive layer 83 is formed. As a result, the conductive layer 83 fills the through holes 35X and covers the entire upper surface 35A of the insulating layer 35. As this occurs, as shown in FIG. 6B, a part of filler particles F1 contained in the insulating layer 35 are exposed from the upper surface 35A of the insulating layer 35. Also, the exposed filler particles F1 are buried in the conductive layer 83 formed on the upper surface 35A of the insulating layer 35.

Figure 7A:
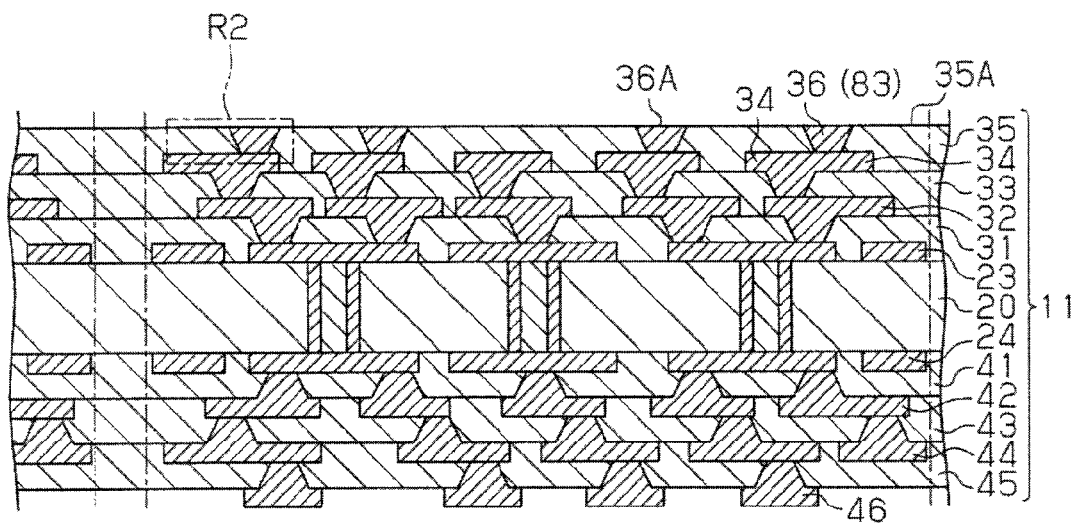
FIG. 7A is a schematic section view showing the method for manufacturing the wiring board according to the first exemplary embodiment.
Figure 7B:
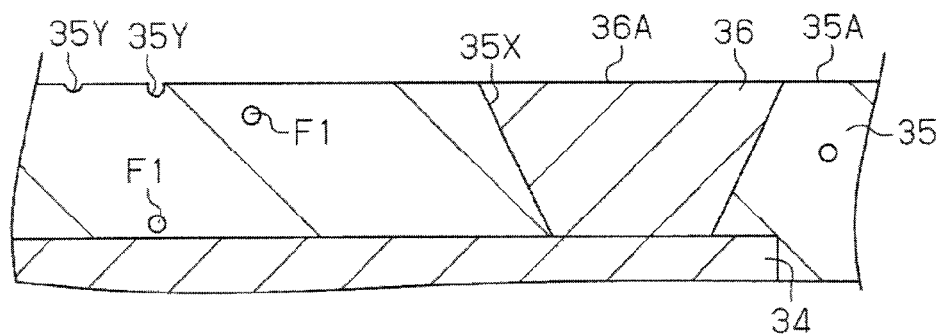
FIG. 7B is an enlarged section view of a region R2 of FIG. 7A.

Subsequently, at a step shown in FIG. 7A, the conductive layer 83 protruding from the upper surface 35A of the insulating layer 35 is polished by the CMP (chemical mechanical polishing) process or the like. Also, a portion of the roughened upper surface 35A of the insulating layer 35 is polished. As a result, the via wirings 36 are formed which fill the through holes 35. The upper end surfaces 36A of the via wirings 36 and the upper surface 35A of the insulating layer 35 are exposed. Also, the upper surface 35A of the insulating layer 35 is smoothed by polishing the portion of the upper surface 35A of the insulating layer 35. For example, whereas the surface roughness Ra of the upper surface 35A of the insulating layer 35 is in a range of about 300 to 400 nm before the polishing, the surface roughness Ra of the upper surface 35A of the insulating layer 35 becomes in a range of about 15 to 40 nm after the polishing. Furthermore, as shown in FIG. 7B, polishing the portion of the upper surface 35A of the insulating layer 35 removes the filler particles F1 exposed from the upper surface 35A of the insulating layer 35. Thereby, the recess portions 35Y are formed in the upper surface 35A of the insulating layer 35. In other words, this step polishes the upper surface 35A of the insulating layer 35 and the conductive layer 83 so that (i) the upper surface 35A of the insulating layer 35 is smoothed (e.g., to have about 15 to 40 nm in surface roughness Ra) and (ii) the recess portions 35Y are formed in the upper surface 35A of the insulating layer 35. The inner side surfaces of the through holes 35X are kept roughened. Therefore, the surface roughness of the upper surface 35A of the insulating layer 35 becomes lower than that of the inner side surfaces of the through holes 35X.

The structural body corresponding to the wiring structure 11 is manufactured by the above-described manufacturing steps.

Figure 8A:
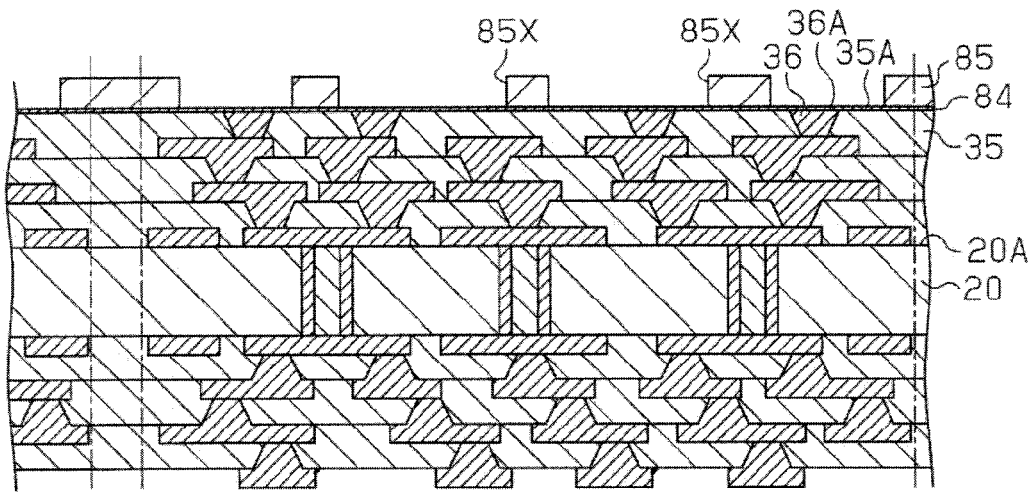
FIGS. 8A and 8B are a set of schematic section views showing the method for manufacturing the wiring board according to the first exemplary embodiment.

Next, in a step shown in FIG. 8A, a seed layer 84 is formed on the entire surface, on the upper surface 20A side of the core substrate 20, of the structural body. The seed layer 84 is formed, for example, by sputtering or electroless plating. The upper surface 35A of the insulating layer 35 is the smooth surface. Therefore, this step can form the seed layer 84 uniformly on the upper surface 35A by sputtering and make an upper surface of the seed layer 84 smooth. Therefore, the seed layer 84 can be made thinner than in a case where a seed layer is formed on a roughened surface by sputtering. An exemplary procedure for forming the seed layer 84 by sputtering is as follows. First, a titanium (Ti) layer is formed. For example, titanium is deposited on the upper surface 35A of the insulating layer 35 and the upper end surfaces 36A of the via wirings 36 by sputtering so as to cover the upper surface 35A of the insulating layer 35 and the upper end surfaces 36A of the via wirings 36. Then, a cupper (Cu) layer is formed by depositing copper on the Ti layer by sputtering. As a result, the seed layer 84 having a two-layer structure (Ti layer/Cu layer) is formed. The Ti layer may have, for example, about 20 to 50 nm in thickness. The Cu layer may have, for example, about 100 to 300 nm in thickness. Forming the Ti layer as the lower layer of the seed layer 84 in this manner makes it possible to increase an adhesion property between the insulating layer 35 and the seed layer 84. Alternatively, the Ti layer may be replaced by a titanium nitride (TiN) layer. That is, the seed layer 84 having a two-layer structure (TiN layer/Cu layer) may be formed. Titanium and titanium nitride are metals which are higher in corrosion resistance than copper. Further alternatively, the seed layer 84 may be formed by electroless plating. In this case, the seed layer 84 having, for example, a single layer structure (Cu layer) may be formed by electroless copper plating.

Before the formation of the seed layer 84, the upper surface 35A of the insulating layer 35 may be subjected to plasma processing such as $O_2$ plasma ashing. The plasma processing can roughen the upper surface 35A of the insulating layer 35. Roughening the upper surface 35A of the insulating layer 35 can increase the adhesion property between the seed layer 84 and the insulating layer 35. However, increase of smoothness of the upper surface 35A of the insulating layer 35 (reduction of the roughness of the upper surface 35A of the insulating layer 35) makes it possible to form fine wirings on the upper surface 35A. Thus, in the above plasma processing, the upper surface 35A of the insulating layer 35 should be roughened to such an extent that the roughness of the upper surface 35A will not impair forming of the fine wirings in later steps.

Where the seed layer 84 is formed in this step so as to fill the recess portions 35Y, a contact area between the insulating layer 35 and the seed layer 84 is increased accordingly. As a result, the adhesion property between the insulating layer 35 and the seed layer 84 is enhanced.

Next, a resist layer 85 having opening portions 85X at prescribed positions is formed on the seed layer 84. The opening portions 85X are formed so that portions, corresponding to regions where the wiring layer 50 is formed (see FIG. 1), of the seed layer 84 are exposed through the opening portions 85X. The resist layer 85 may be made of, for example, a material that is resistant to plating to be performed in the next step. Specifically, examples of the material of the resist layer 85 include a photosensitive dry film resist and a liquid photoresist (e.g., a dry film resist and a liquid resist made of a novolac-based resin or an acrylic-based resin). For example, where a photosensitive dry film resist is used, the resist layer 85 having the opening portions 85X is formed by laminating the dry film on an upper surface of the seed layer 84 by thermocompression bonding. Then, patterning is performed for the dry film by photolithography. Where a liquid photoresist is used, the liquid photoresist is applied to the upper surface of the seed layer 84. Then, patterning is performed for the photoresist by photolithography. In this step, the upper surface of the seed layer 84 on which the resist layer 85 is to be formed is the smooth surface. Therefore, formation of patterning defects in the resist layer 85 can be suppressed. That is, the opening portions 85X can be formed through the resist layer 85 with high accuracy.

Figure 8B:
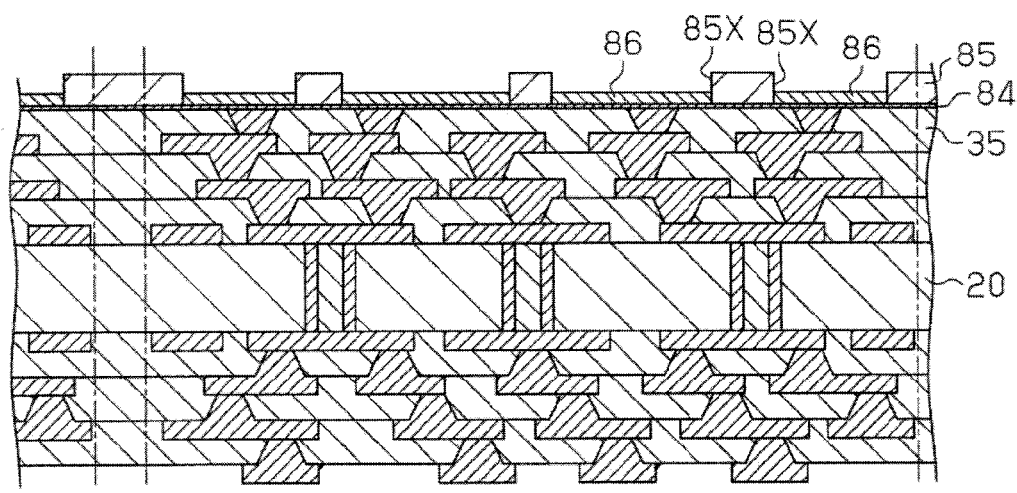

In a step shown in FIG. 8B, the upper surface of the seed layer 84 is subjected to electrolytic plating using the resist layer 85 as a plating mask. During the electrolytic plating, the seed layer 84 serves as the plating power supply layer. More specifically, the electrolytic plating (electrolytic copper plating) is performed for the upper surface, exposed through the opening portions 85X of the resist layer 85, of the seed layer 84. Thereby, a metal layer 86 (electrolytically plated metal layer) is formed on the upper surface of the seed layer 84.

Figure 9A:
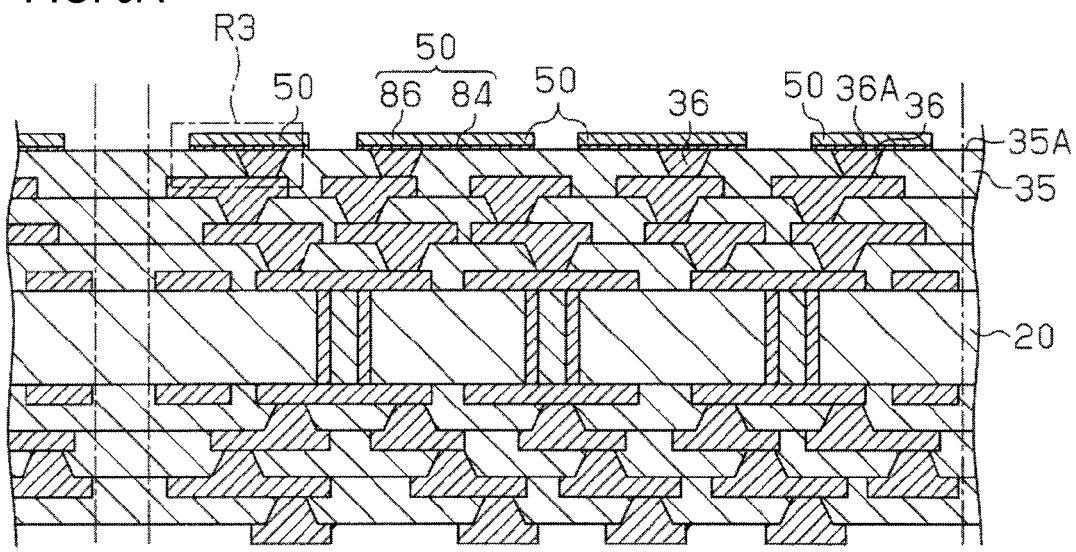
FIG. 9A is a schematic section view showing the method for manufacturing the wiring board according to the first exemplary embodiment.
Figure 9B:
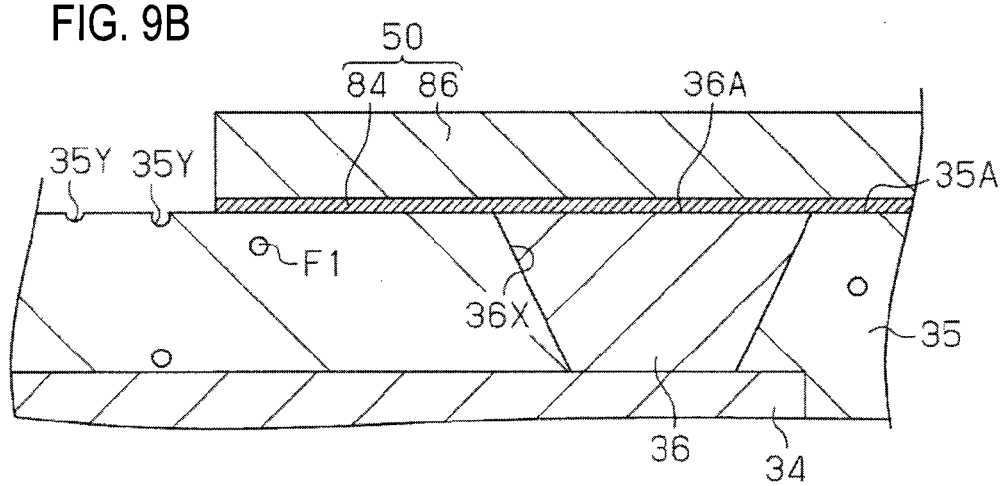
FIG. 9B is an enlarged section view of a region R3 of FIG. 9A.

Subsequently, the resist layer 85 is removed, for example, with an alkaline peeling solution. Also, unnecessary portions of the seed layer 84 are removed by etching using the metal layer 86 as an etching mask. As a result, as shown in FIGS. 9A and 9B, the wiring layer 50 is formed on the upper end surfaces 36A of the via wirings 36 and the upper surface 35A of the insulating layer 35. As shown in FIG. 9B, the wiring layer 50 includes (i) the seed layer 84 which is joined to the upper end surfaces 36A of the via wirings 36 and (ii) the metal layer 86 formed on the seed layer 84. In this manner, the wiring layer 50 is formed by the semi-additive process. Also, the wiring layer 50 and the via wirings 36 are formed in separate steps. Therefore, the wiring layer 50 is not integral with the via wirings 36.

Figure 10A:
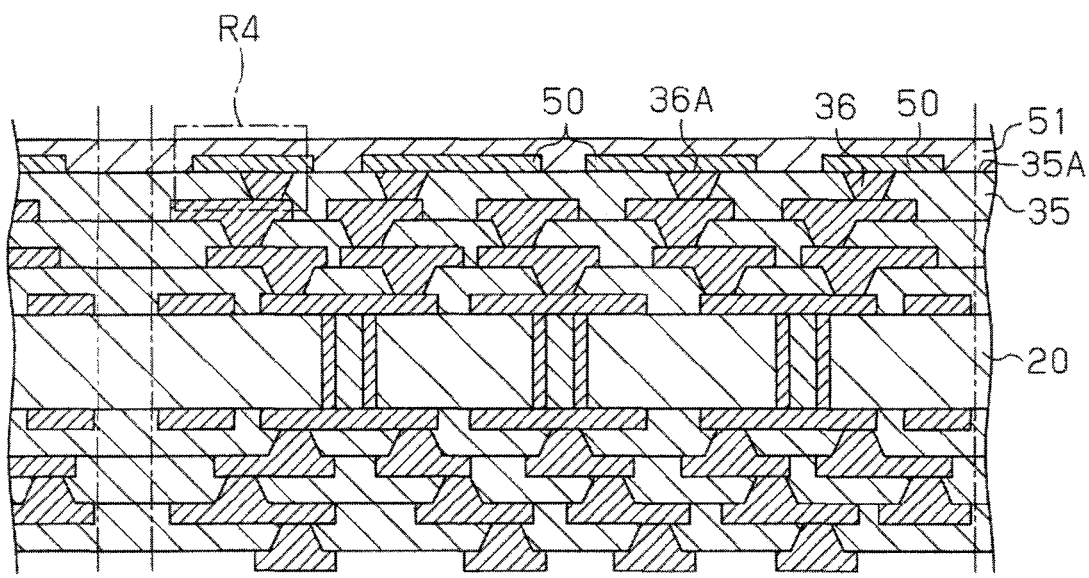
FIG. 10A is a schematic section view showing the method for manufacturing the wiring board according to the first exemplary embodiment.
Figure 10B:
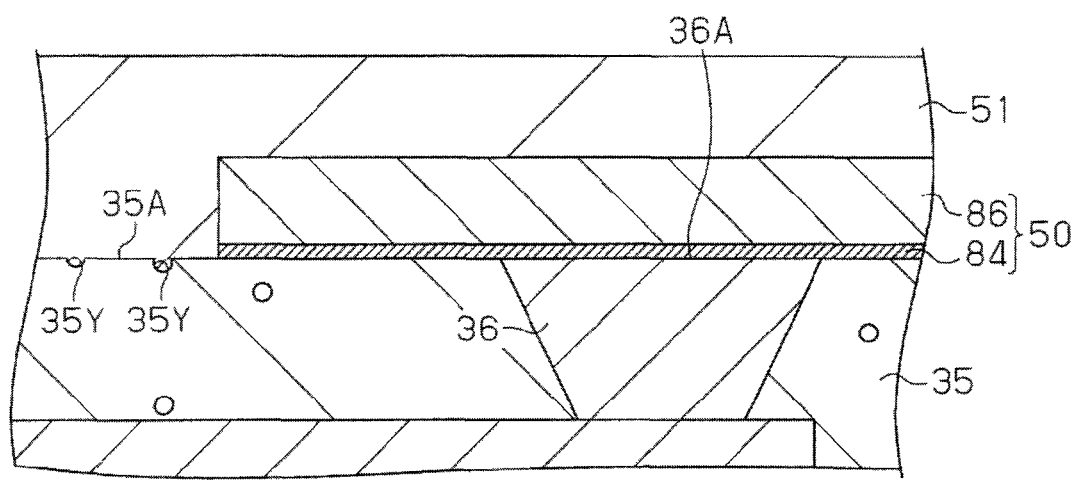
FIG. 10B is an enlarged section view of a region R4 of FIG. 10A.

In a step shown in FIG. 10A, the insulating layer 51 is formed on the upper surface 35A of the insulating layer 35 so as to cover the entire surface (upper surface and side surfaces) of the wiring layer 50. As shown in FIG. 10B, the insulating layer 51 is formed so as to fill the recess portions 35Y of the insulating layer 35. A resin film may be used as the insulating layer 51. In this case, the insulating layer 51 may be formed by, for example, laminating the resin film on the upper surface 35A of the insulating layer 35 by thermocompression bonding. Laminating the resin film in a vacuum atmosphere can prevent involvement of voids. Examples of the resin film include a photosensitive resin film made of a phenol-based resin and a photosensitive resin film made of a polyimide-based resin. Alternatively, a liquid or past-like insulating resin may be used as the insulating layer 51. In this case, the insulating layer 51 may be formed by, for example, applying the liquid or past-like insulating resin to the upper surface 35A of the insulating layer 35 by spin coating or the like. Examples of the liquid or past-like insulating resin include a photosensitive resin such as a phenol-based resin and a polyimide-based resin.

Figure 11A:
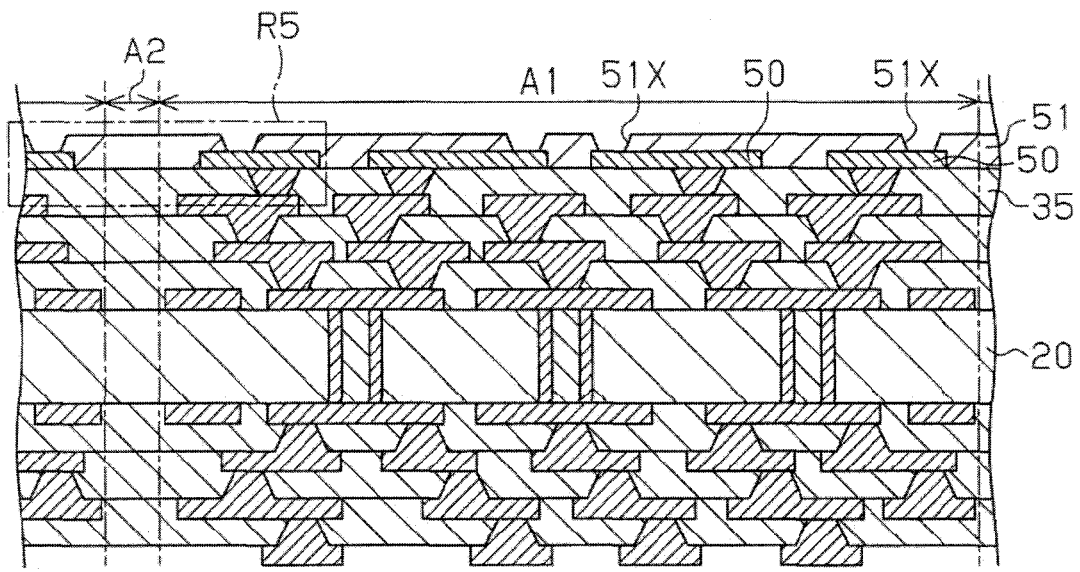
FIG. 11A is a schematic section view showing the method for manufacturing the wiring board according to the first exemplary embodiment.
Figure 11B:
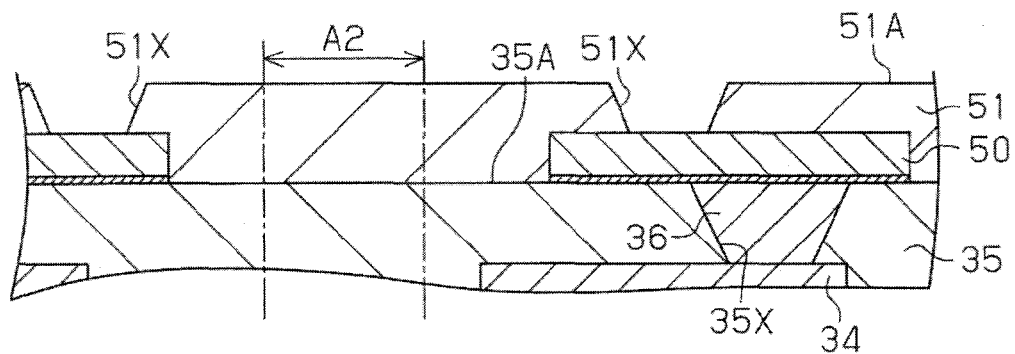
FIG. 11B is an enlarged section view of a region R5 of FIG. 11A.

Subsequently, in a step shown in FIG. 11A, the through holes 51X are formed at the prescribed positions in the insulating layer 51 by photolithography. The through holes 51X penetrate through the insulating layer 51 in the thickness direction. The portions of the upper surface of the wiring layer 50 are exposed through the through holes 51X. It is noted that, as shown in FIG. 11B, the insulating layer 51 still covers the upper surface 35A of the insulating layer 35 in the cutting region A2 and a region around the cutting region A2. In other words, the insulating layer 51 still covers all the portions, exposed from the wiring layer 50, of the upper surface 35A of the insulating layer 35. The surface roughness Ra of the upper surface 51A of the insulating layer 51 made of the photosensitive resin may be, for example, in a range of about 2 to 10 nm. That is, the upper surface 51A of the insulating layer 51 is lower in surface roughness than the inner side surfaces of the through holes 35X and is lower in surface roughness than the upper surface 35A of the insulating layer 35.

Figure 12:
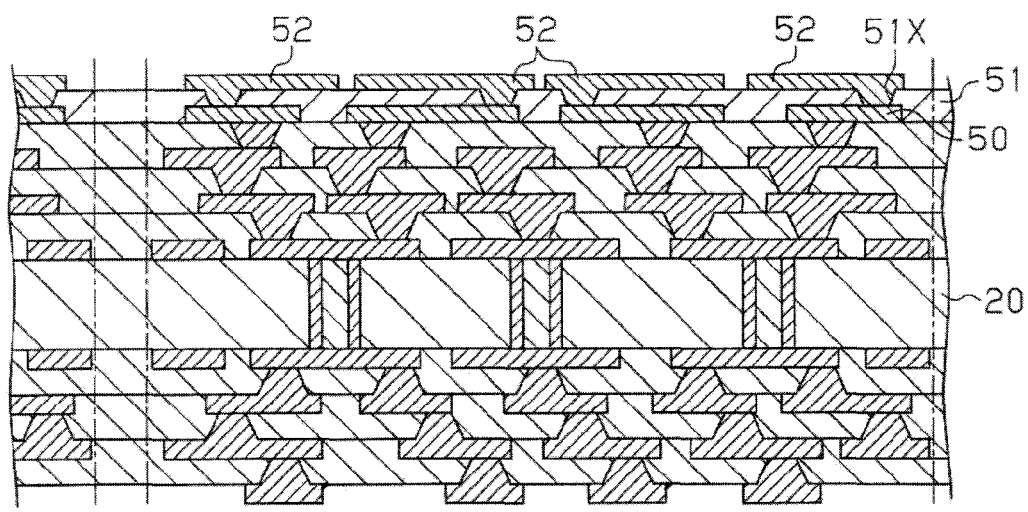
FIG. 12 is a schematic section view showing the method for manufacturing the wiring board according to the first exemplary embodiment.

Next, in a step shown in FIG. 12, the wiring layer 52 is formed. The wiring layer 52 includes the via wirings and the wiring pattern. The via wirings of the wiring layer 52 fill the through holes 51X of the insulating layer 51. The wiring pattern of the wiring layer 52 is stacked on the upper surface of the insulating layer 51 and electrically connects to the wiring layer 50 via the via wirings of the wiring layer 52. An exemplary method for forming the wiring layer 52 will be described below.

Figure 13A:
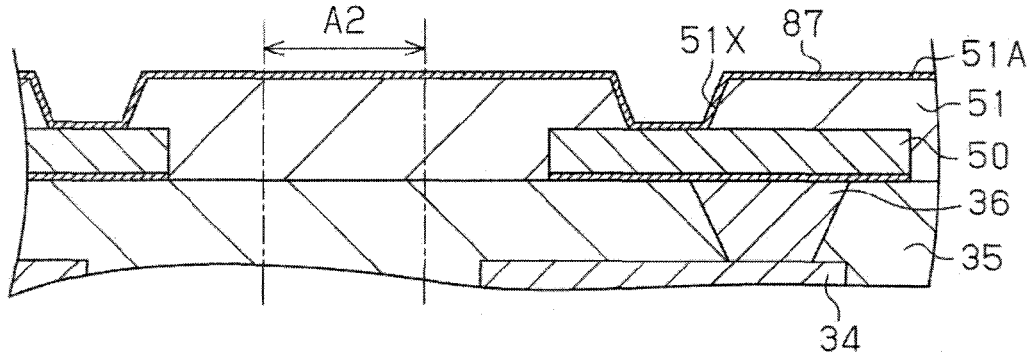
FIGS. 13A to 13C are a set of schematic section views showing the method for manufacturing the wiring board according to the first exemplary embodiment and enlarged section views of portions corresponding to a region R5 of FIG. 11A.

First, in a step shown in FIG. 13A, a seed layer 87 is formed by sputtering or electroless plating so as to cover the entire upper surface 51A of the insulating layer 51 including the inner surfaces of the through holes 51X. The upper surface 51A of the insulating layer 51 is the smooth surface as described above. Therefore, this step can form the seed layer 87 uniformly on the upper surface 51A, for example, by sputtering. An exemplary procedure for forming the seed layer 87 by sputtering is as follows. First, a titanium (Ti) layer is formed. For example, titanium is deposited on the upper surface 51A of the insulating layer 51 by sputtering so as to cover the entire upper surface 51A of the insulating layer 51 including the inner surfaces of the through holes 51X. Then, a cupper (Cu) layer is then formed on the Ti layer by depositing copper thereon by sputtering. As a result, the seed layer 87 having a two-layer structure (Ti layer/Cu layer) is formed. It is noted that the insulating layer 51 containing the photosensitive resin as a main component covers the entire upper surface 35A of the insulating layer containing the thermosetting resin as a main component. That is, the insulating layer 51 covers the entire upper surface 35A including the upper surface 35A of the insulating layer 35 in the cutting region A2. Unlike the opening portion 112X of the insulating layer 112 of the related art (see FIGS. 25A and 25B), an opening portion having an inverted taper shape is not formed in the insulating layer 51. Therefore, the seed layer 87 (sputtering film) can be formed properly to continuously cover (i) the upper surface 51A of the insulating layer 51, (ii) the inner side surfaces of the through holes 51X, and (iii) the portions, exposed to the lower portions of the through holes 51X, of the upper surface of the wiring layer 50. The Ti layer may have, for example, about 20 to 50 nm in thickness. Also, the Cu layer may have, for example, about 100 to 300 nm in thickness. Alternatively, the Ti layer may be replaced by a titanium nitride (TiN) layer to form the seed layer 87 having a two-layer structure (TiN layer/Cu layer).

Alternatively, the seed layer 87 may be formed by electroless plating. In this case, the seed layer 87 having, for example, a single layer structure (Cu layer) may be formed by electroless copper plating.

Figure 13B:
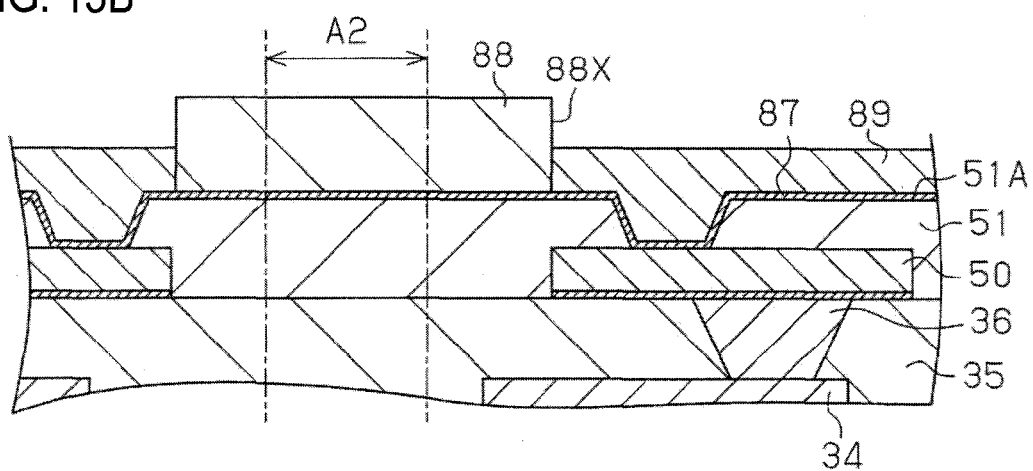

Next, in a step shown in FIG. 13B, a resist layer 88 having opening portions 88X corresponding to a pattern of the wiring layer 50 are formed on the seed layer 87. Then electrolytic plating (e.g., electrolytic copper plating) is performed using the seed layer 87 as a plating power supply layer. As a result, an electrolytically plated copper layer 89 is stacked on portions, exposed through the opening portions 88X of the resist layer 88, of the seed layer 87 so as to fill the through holes 51X. At this time, the seed layer 87 is formed so as to continuously cover (i) the upper surface 51A of the insulating layer 51, (ii) the inner side surfaces of the through holes 51X, and (iii) the portions, exposed to the lower portions of the through holes 51X, of the wiring layer 50, as described above. Therefore, a power supply failure can be prevented suitably. As a result, a plating failure can be suppressed as desired.

Figure 13C:
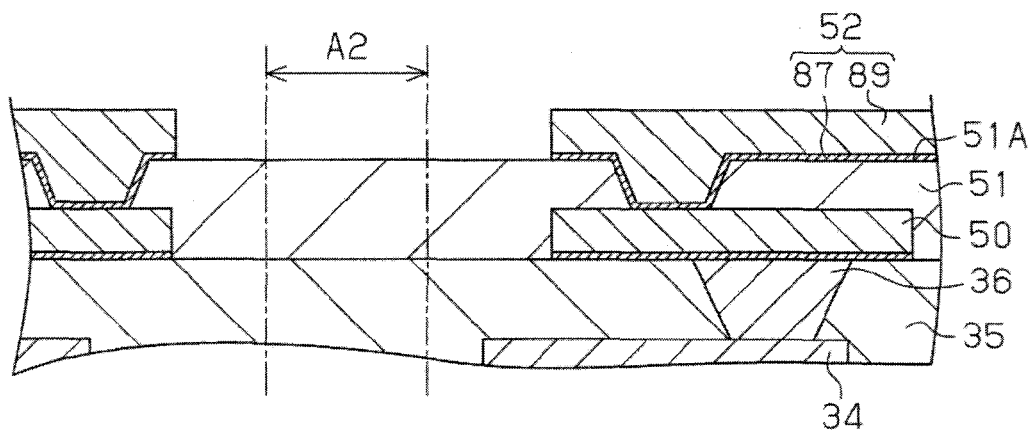

Subsequently, the resist layer 88 is removed, for example, with an alkaline peeling solution. Then, unnecessary portions of the seed layer 87 are removed by etching using the electrolytically plated copper layer 89 as a mask. As a result, as shown in FIG. 13C, the wiring layer 52 including the seed layer 87 and the electrolytically plated copper layer 89 is formed on the insulating layer 51. In this manner, the wiring layer 52 is formed by the semi-additive process.

Figure 14A:
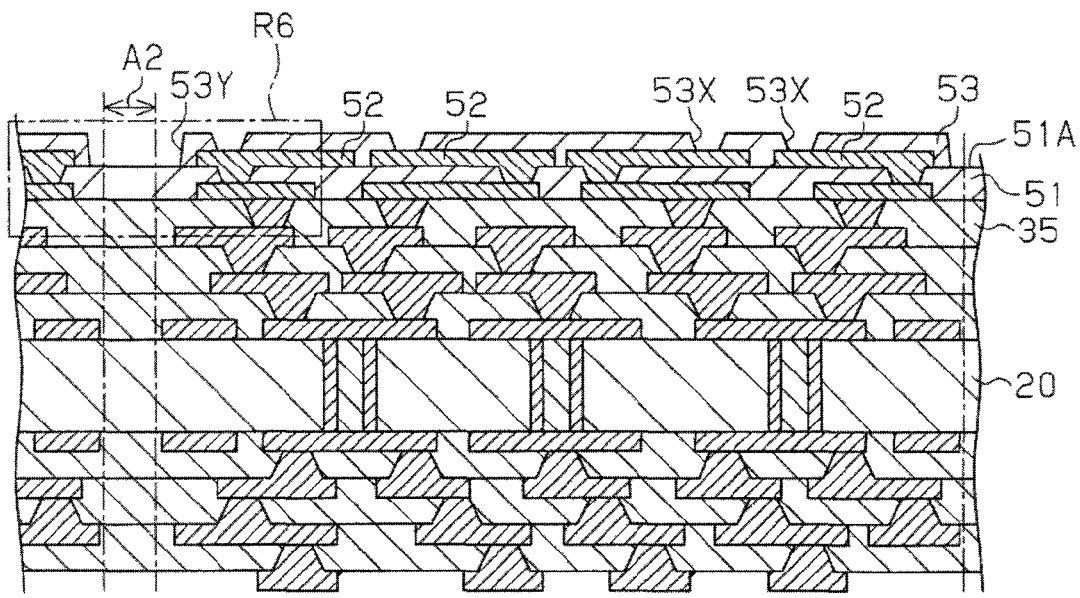
FIG. 14A is a schematic section view showing the method for manufacturing the wiring board according to the first exemplary embodiment.
Figure 14B:
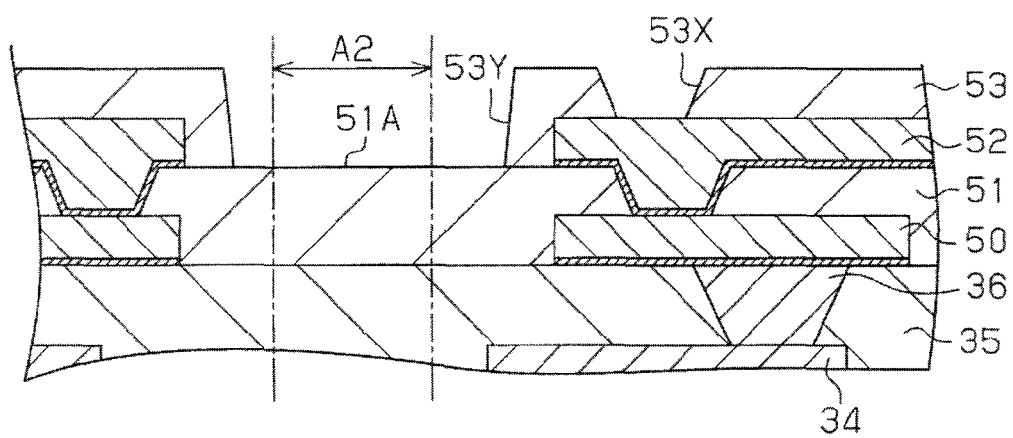
FIG. 14B is an enlarged section view of a region R6 of FIG. 14A.

In a step shown in FIG. 14A, in a similar manner to the steps shown in FIGS. 10A to 11B, the insulating layer 53 having the through holes 53X and the opening portion 53Y is formed on the upper surface 51A of the insulating layer 51. The through holes 53X are formed so that portions of the upper surface of the wiring layer 52 are exposed through the through holes 53X. As shown in FIG. 14B, the opening portion 53Y is formed so that a portion of the upper surface 51A of the insulating layer 51 is exposed through the opening portion 53Y in the cutting region A2 and a region around the cutting region A2. Accordingly, the portion of the upper surface 51A (smooth surface) of the insulating layer 51 containing the photosensitive resin as a main component is exposed through the opening portion 53Y of the insulating layer 53 containing the photosensitive resin as a main component. Therefore, the opening portion 53Y can be formed suitably to have such a taper shape that a diameter of the opening portion 53 increases from the lower side (the insulating layer 51 side) to the upper side in FIG. 14B. In other words, the opening portion 53Y is not one that exposes a portion of an insulating layer containing a thermosetting resin as a main component and having a surface from which many filler particles are exposed. Rather, the portion of the insulating layer containing the photosensitive resin as a main component is exposed through the opening portion 53Y. Since there is no diffuse reflection by filler particles, it can be suppressed appropriately that the opening portion 53Y is formed so as to have an inverted taper shape.

Figure 15A:
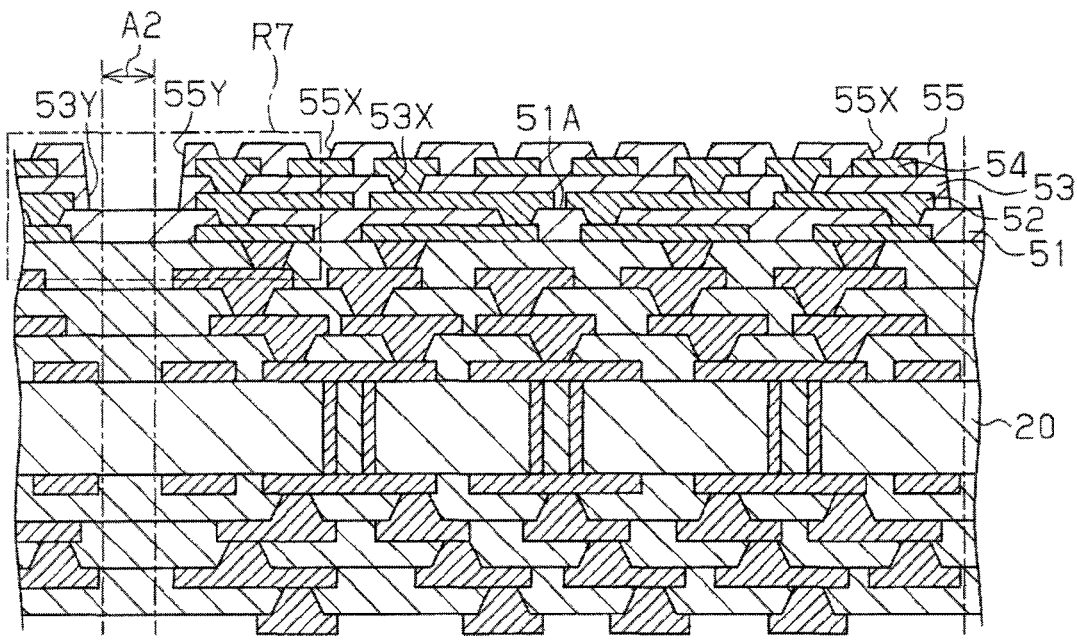
FIG. 15A is a schematic section view showing the method for manufacturing the wiring board according to the first exemplary embodiment.
Figure 15B:
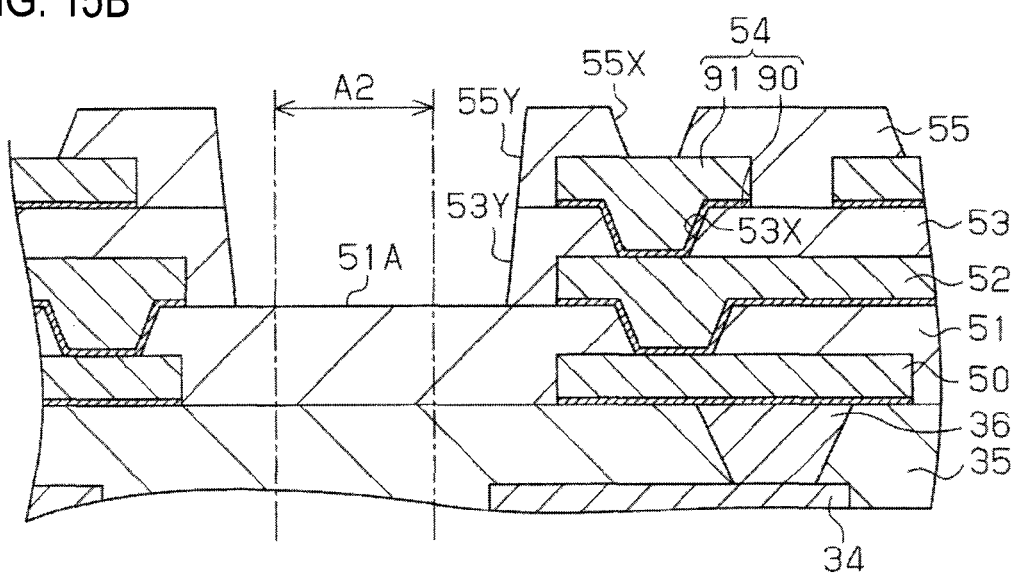
FIG. 15B is an enlarged section view of a region R7 of FIG. 15A.

In a step shown in FIGS. 15A and 15B, in a similar manner to the steps shown in FIGS. 12 to 13C, the wiring layer 54 is formed by, for example, the semi-additive process. The wiring layer 54 includes the via wirings and the wiring pattern. The via wirings of the wiring layer 54 fill the through holes 53X of the insulating layer 53. The wiring pattern of the wiring layer 54 is stacked on the upper surface of the insulating layer 53 and electrically connects to the wiring layer 52 via the via wirings of the wiring layer 54. As shown in FIG. 15B, like the wiring layer 52, the wiring layer 54 is formed of a seed layer 90 and an electrolytically plated copper layer 91 formed on the seed layer 90. The through holes 53X and the opening portion 53Y are formed in the taper shapes. Therefore, in this step, the seed layer 90 to be used as a plating power supply layer can be formed so as to continuously cover (i) the upper surface of the insulating layer 53, (ii) the inner side surfaces of the through holes 53X, (iii) the portions, exposed to the through holes 53X, of the upper surface of the wiring layer 52, (iv) the inner side surfaces of the opening portion 53Y, and (v) the portion, exposed to the through hole 53Y, of the upper surface 51A of the insulating layer 51.

Subsequently, in a similar manner to the steps shown in FIGS. 10A to 11B, the insulating layer 55 is formed on the upper surface 53A of the insulating layer 53. The insulating layer 55 is formed with the through holes 55X and the opening portion 55Y. Portions of the upper surface of the wiring layer 54 are exposed through the through holes 55X. As shown in FIG. 15B, a portion, located in the cutting region A2 and in the region around the cutting region A2, of the upper surface 51A of the insulating layer 51 the opening portion 55Y is exposed through the opening portion 55Y. That is, the portion of the upper surface 51A (smooth surface) of the insulating layer 51 containing the photosensitive resin as a main component is exposed through the opening portion 55Y of the insulating layer 55 containing the photosensitive resin as a main component. Therefore, the opening portion 55Y can be formed suitably to have the taper shape so that the diameter of the opening portion 55Y increases from the lower side to the upper side in FIG. 15B.

Figure 16A:
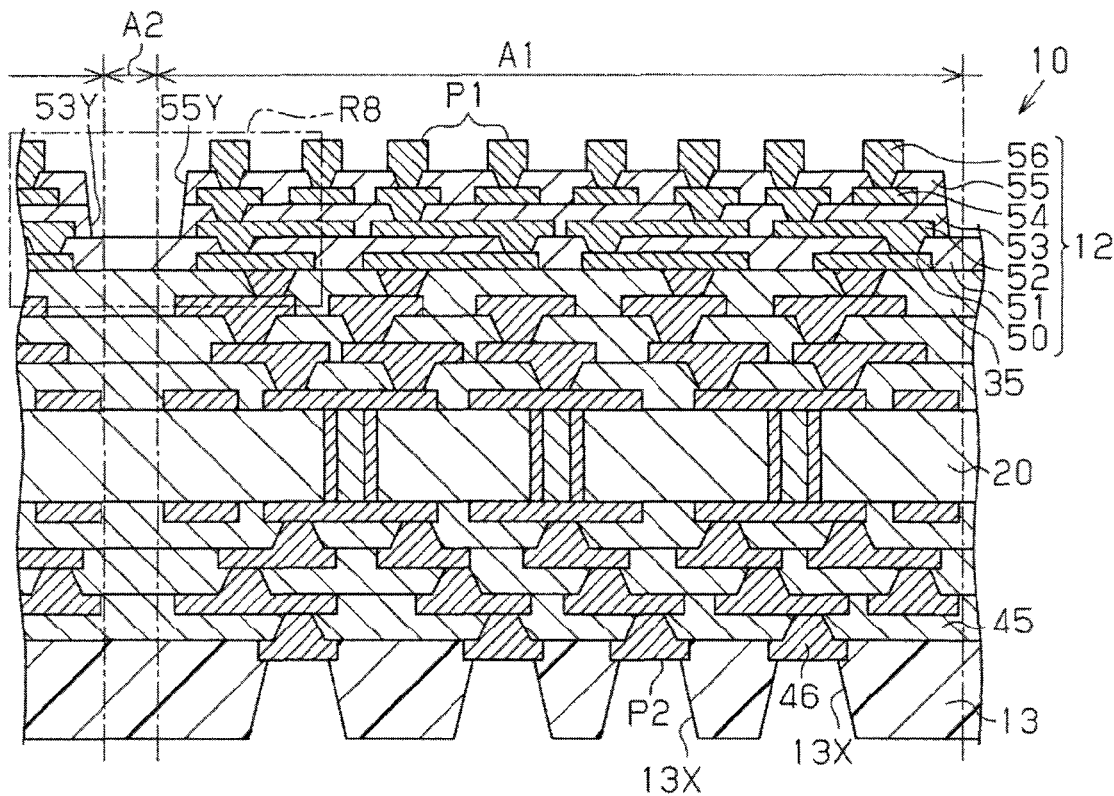
FIG. 16A is a schematic section view showing the method for manufacturing the wiring board according to the first exemplary embodiment.
Figure 16B:
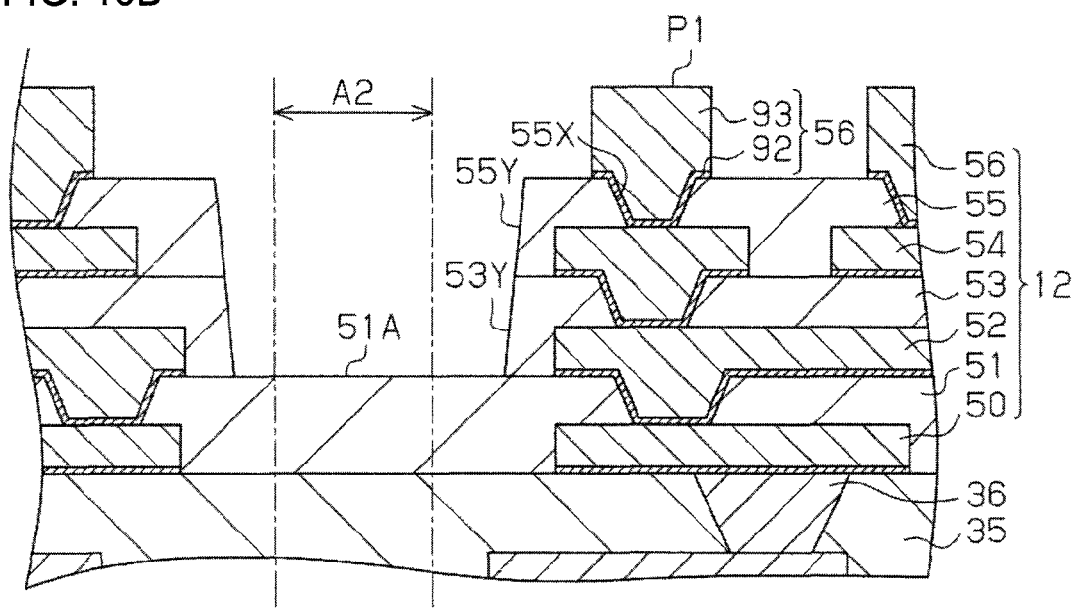
FIG. 16B is an enlarged section view of a region R8 of FIG. 16A.

Next, in a step shown in FIGS. 16A and 16B, in a similar manner to the steps shown in FIGS. 12 to 13C, the wiring layer 56 is formed by, for example, the semi-additive process. The wiring layer 56 includes the via wirings and the pads P1. The via wirings of the wiring layer 56 fill the through holes 55X of the insulating layer 55. The pads P1 are stacked on the upper surface of the insulating layer 55 and electrically connect to the wiring layer 54 via the via wirings of the wiring layer 56. As shown in FIG. 16B, like the wiring layers 52 and 54, the wiring layer 56 is formed of a seed layer 92 and an electrolytically plated copper layer 93 formed on the seed layer 92. The through holes 55X and the opening portion 55Y are formed in the taper shapes. Therefore, in this step, the seed layer 92 to be used as a plating power supply layer can be formed so as to continuously cover the entire upper surface of the insulating layer 55. More specifically, the seed layer 92 can be formed suitably so as to continuously cover (i) the upper surface of the insulating layer 55, (ii) the inner side surfaces of the through holes 55X, (iii) the portions, exposed to the through holes 55X, of the upper surface of the wiring layer 54, (iv) the inner side surfaces of the opening portions 55Y and 53Y, and (v) the portion, exposed to the through holes 55Y and 53Y, of the upper surface 51A of the insulating layer 51. If necessary, surface treatment layers may be formed on the surfaces of the pads P1.

The formation of the structural body corresponding to the wiring structure 12 is completed by the above-described manufacturing steps.

Subsequently, as shown in FIG. 16A, the solder resist layer 13 is stacked on the lower surface of the insulating layer 45. The solder resist layer 13 is formed with the opening portions 13X. The external connection pads P2 which are defined at the prescribed positions in the lowermost wiring layer 46 are exposed through the opening portions 13X. At this time, the thickness of the solder resist layer 13 (i.e., the thickness from the lower surface of the insulating layer 45 to the lower surface of the solder resist layer 13) is equal to or larger than the thickness of the wiring structure 12 (i.e., the thickness from the upper surface 35A of the insulating layer 35 to the upper surface of the insulating layer 55). The solder resist layer 13 may be formed by, for example, (i) laminating a photosensitive solder resist film on the lower surface of the insulating layer 45 or applying a liquid solder resist to the lower surface of the insulating layer 45 and (ii) then patterning the resist into a prescribed shape. As a result, portions of the wiring layer 46 are exposed through the opening portions 13X of the solder resist layer 13 and serve as the external connection pads P2.

If necessary, surface treatment layers may be formed on the respective portions, exposed through the respective opening portions 13X of the solder resist layer 13, of the wiring layer 46 (i.e., on the respective external connection pads P2). The solder resist layer 13 may be formed at any time after the wiring layer 46 is formed. For example, the solder resist layer 13 may be formed after the step shown in FIG. 6A.

The formation of the structural body corresponding to the wiring board 10 in each region A1 is completed by the above-described manufacturing steps.

Figure 17A:
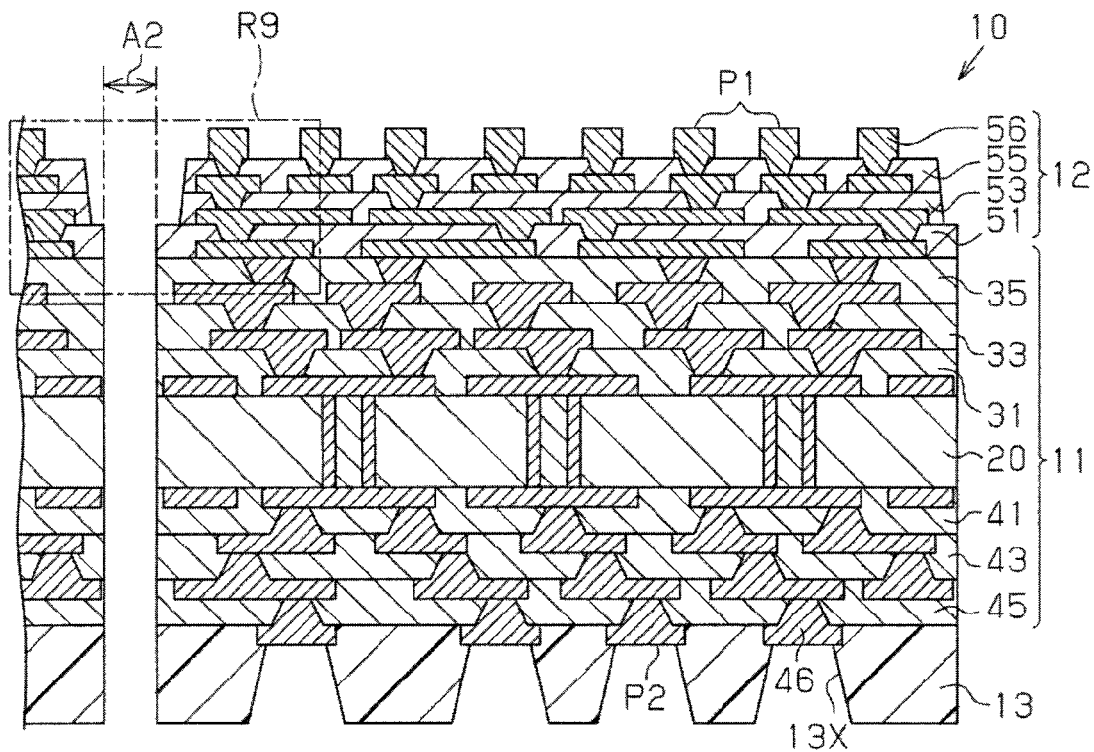
FIG. 17A is a schematic section views showing the method for manufacturing the wiring board according to the first exemplary embodiment.
Figure 17B:
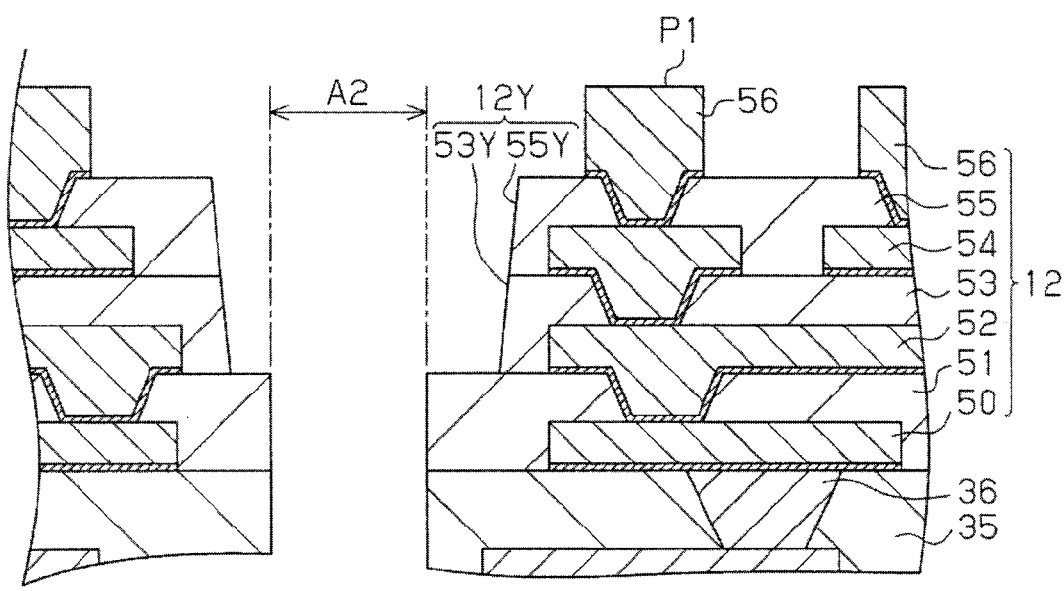
FIG. 17B is an enlarged section view of a region R9 of FIG. 17A.

Next, in a step shown in FIGS. 17A and 17B, the structural body shown in FIG. 16A is cut in the cutting regions A2 using a dicing blade or the like. Thereby, a plurality of individual wiring boards 10 is obtained. At this time, no portions of the insulating layers 53 and 55 containing the photosensitive resin as a main component are staked on the insulating layer 51 containing the photosensitive resin as a main component. Therefore, it can be suitably suppressed that peeling occurs between the insulating layers 51, 53, and 55 during the dicing process. Furthermore, the insulating layer 51 is formed so as to fill the minute recess portions 35Y (see FIG. 10B) which are formed in the upper surface 35A of the insulating layer 35. Therefore, the adhesion property between the insulating layers 51 and 35 can be enhanced as compared with the case where no recess portions 35Y are formed in the upper surface 35A of the insulating layer 35. As a result, it can be suitably suppressed that peeling occurs between the insulating layer 51 and 35 during the dicing process.

As shown in FIG. 17B, as a result of the above separation into the individual units, the outer side surfaces of the insulating layer 51 are made flush with those of the insulating layer 35. Also, the cut-out portion 12Y is formed by the opening portions 53Y and 55Y at the outer periphery of the wiring structure 12.

Next, a method for manufacturing the above-described semiconductor device 60 will be described.

Figure 18:
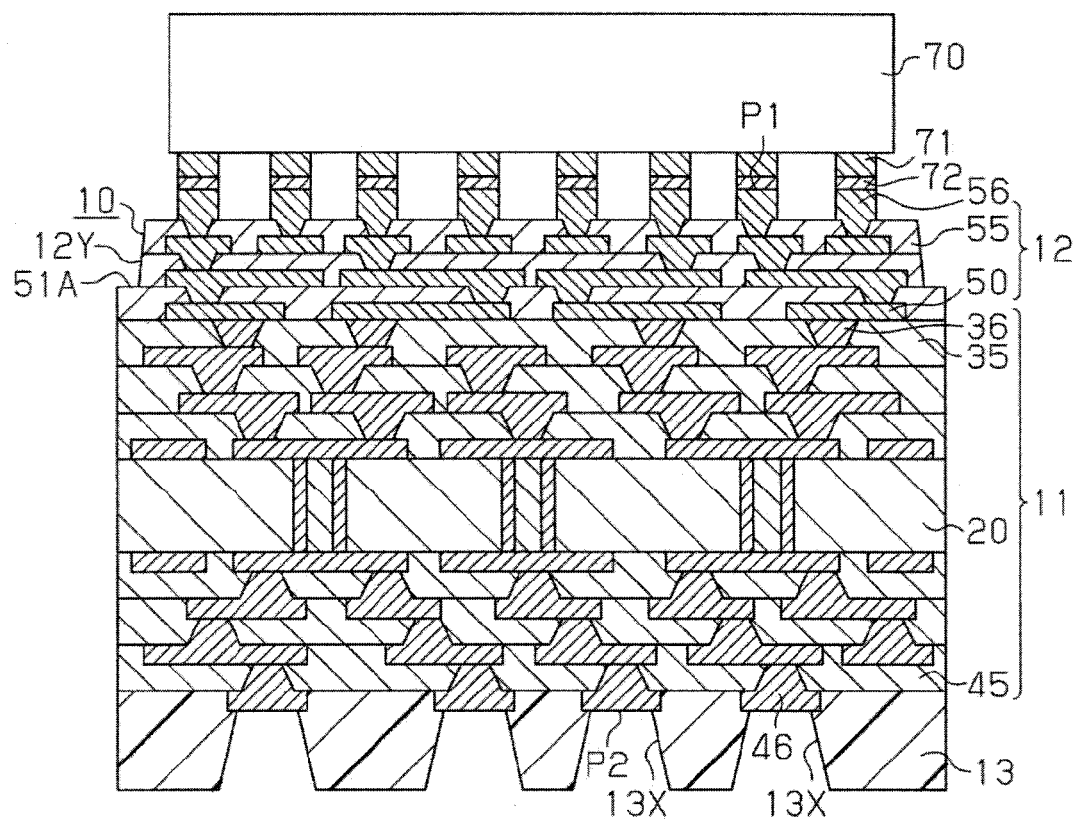
FIG. 18 is a schematic section view showing a method for manufacturing the semiconductor device according to the first exemplary embodiment.

In a step shown in FIG. 18, first, a semiconductor chip 70 having columnar connection terminals 71 is prepared. The connection terminals 71 can be manufactured by a known manufacturing method. Thus, detailed description on a method for manufacturing the connection terminals 71 will be omitted, and drawings showing the method for manufacturing the connection terminals 71 will not be provided. An example of the method for manufacturing the connection terminals 71 will be briefly described below.

First, a protective film is formed on the circuit formation surface (in this example, lower surface) of the semiconductor chip 70. The protective film is formed with opening portions, for example, through which electrode pads are exposed. A seed layer is formed so as to cover a lower surface of the protective film and lower surfaces of the electrode pads. Then, a resist layer is formed so that portions, corresponding to regions where connection terminals 71 are to be formed of the seed layer (i.e., portions of the seed layer which cover the lower surfaces of the electrode pads) are exposed from the resist layer. Columnar connection terminals 71 are then formed on the electrode pads. The columnar connection terminals 71 may be formed, for example, by performing electrolytic plating (e.g., electrolytic copper plating) for the portions, exposed from the resist layer, of the seed layer using the seed layer as an electricity supply layer.

Subsequently, joining members 72 are formed on the lower surfaces of the connection terminals 71. For example, the joining members 72 may be formed by coating the lower surfaces of the connection terminals 71 with solder. The lower surfaces of the connection terminals 71 are coated with the solder by performing electrolytic solder plating using the resist layer as a plating mask and using the seed layer as an electricity supply layer. Then, unnecessary portions of the seed layer and the resist layer are removed.

The connection terminals 71 of the semiconductor chip 70 are then flip-chip-bonded to the pads P1 of the wiring board 10. For example, after the wiring board 10 and the semiconductor chip 70 are positioned with respect to each other, reflow processing is performed. Thereby, the joining members 72 (solder plating layers) are melted, and the connection terminals 71 electrically connect to the pads P1.

Thereafter, a space between the flip-chip-bonded semiconductor chip 70 and the wiring board 10 is filled with the underfill resin 75 (see FIG. 3). Then, the underfill resin 75 is set. The manufacture of the semiconductor device 60 shown in FIG. 3 is completed by the above-described manufacturing steps.

The above-described exemplary embodiment provides the following advantages:

(1) The insulating layer 51 containing the photosensitive resin as a main component is formed on the insulating layer 35 containing the thermosetting resin as a main component so as to cover the entire upper surface 35A, exposed from the wiring layer 50, of the insulating layer 35. That is, the insulating layer 51 is formed so as to cover the portion, located in the cutting region A2 and the region around the cutting region A2, of the upper surface 35A of the insulating layer 35. Therefore, in forming the wiring layer 52 on the insulating layer 51, it is possible to suitably form the seed layer 87 by sputtering so that the seed layer 87 continuously covers (i) the upper surface 51A of the insulating layer 51, (ii) the inner side surfaces of the through holes 51X, and (iii) the portions, exposed through the lower portions of the through holes 51X, of the upper surface of the wiring layer 50. Accordingly, when the electrolytic plating is performed using the seed layer 87 as the plating power supply layer, a power supply failure can be prevented suitably. Hence a plating failure can be suppressed suitably.

(2) The upper surfaces of the insulating layers 51 and 53 containing the photosensitive resin as a main component are low in surface roughness than the upper surface 35A of the insulating layer 35 containing the thermosetting resin as a main component. Therefore, the adhesion property between the insulating layers 51, 53, and 55 containing the photosensitive resin as a main component is low. As a result, peeling tends to occur between the insulating layers 51 and 53 and between the insulating layers 53 and 55 when stress acts on these interfaces during the dicing process. Therefore, in the wiring board 10, no stack structures of the photosensitive resin layers (insulating layers 51, 53, and 55) are formed in the cutting region A2 and the region around the cutting region A2. More specifically, the opening portions 53Y and 55Y are formed in the insulating layers 53 and 55, respectively. The portion, located in the cutting region A2 and the region around the cutting region A2, of the upper surface 51A of the insulating layer 51 is exposed through the opening portions 53Y and 55Y. No portions of the insulating layers 53 and 55 are formed on the portion, located in the cutting region A2 and the region around the cutting region A2, of the insulating layer 51. With this structure, it can be suppressed during the dicing process that stress acts on the interface between the insulating layers 51 and 53 and the interface between the insulating layers 53 and 55. Thus, it can be suppressed suitably that peeling occurs between the insulating layers 51, 53, and 55 during the dicing process.

(3) When the conductive layer 83 and the upper surface 35A of the insulating layer 35 are polished, the filler particles F1 which are exposed from the upper surface 35A of the insulating layer 35 are removed, and recess portions 35Y are formed. The insulating layer 51 is formed so as to fill the recess portions 35Y. Thereby, the contact area between the insulating layer 35 containing the thermosetting resin as a main component and the insulating layer 51 containing the photosensitive resin as a main component is increased by an amount corresponding to the recess portions 35Y. Thereby, the adhesion property between the insulating layers 35 and 51 can be enhanced. In other words, the adhesion property between the insulating layers 35 and 51 is higher than that between the photosensitive resin layers (insulating layers 51, 53, and 55). As a result, even if stress acts on the interface between the insulating layers 35 and 51 during the dicing process, occurrence of peeling between the insulating layers 35 and 51 can be suppressed suitably.

The thickness T2 of the solder resist layer 13 is equal to or larger than the thickness T1 of all the insulating layer of the wiring structure 12. With this structure, the profiles of the physical properties of the wiring board 10 in the vertical direction (thickness direction) are made close to an up-down symmetrical structure with respect to the core substrate 20. The physical properties on both sides of the core substrate 20 in the up and down directions (vertical direction) are well balanced. Therefore, it can be suppressed suitably that the wiring board 10 is warped or deformed due to thermal contraction or the like.

(5) The inner side surfaces of the through holes 35X of the insulating layer 35 are roughened. With this structure, the contact area between the each via wiring 36 and the insulating layer 35 can be made larger than in the case where the inner side surfaces of the through holes 35X are smooth surfaces. Therefore, the adhesion property between the via wirings 36 and the insulating layer 35 is enhanced, and hence the resistance to tensile force due to the difference in linear expansion coefficient between the via wirings 36 and the insulating layer 35 is enhanced. As a result, the reliability of the connection between the via wirings 36 and the insulating layer 35 can be enhanced, and it can be suppressed that the via wirings 36 come off the through hole 35X.

Modifications of First Exemplary Embodiment

The first exemplary embodiment may be modified as appropriate and practiced in various manners as described below.

The numbers of layers (specifically, the wiring layers 32, 34, 42, 44, and 46 and the insulating layers 31, 33, 35, 41, 43, and 45 of the wiring structure 11 of the wiring board 10 according to the first exemplary embodiment) may be modified or changed in various manners. Also, manners of wiring the wiring layers 32, 34, 42, 44, and 46 and the insulating layers 31, 33, 35, 41, 43, and 45 of the wiring structure 11 of the wiring board 10 according to the first exemplary embodiment may be modified or changed in various manners.

Figure 19:
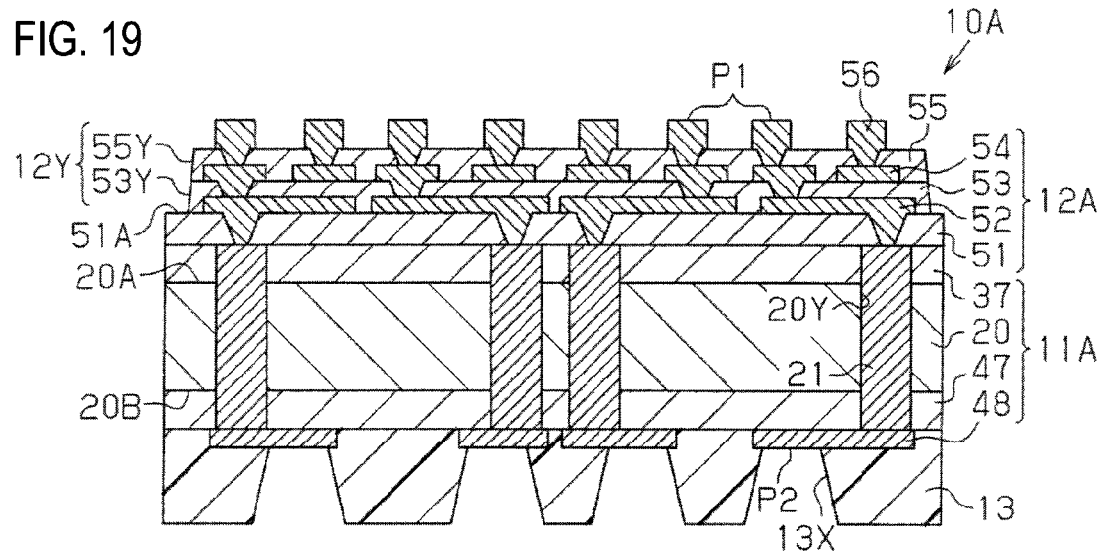
FIG. 19 is a schematic section view of a wiring board according to a modification example of the first exemplary embodiment.

For example, as shown in FIG. 19, the wiring structure 11 may be changed to a wiring structure 11A. The wiring structure 11A does not have a stack structure in which multiple insulating layers and multiple wiring layers are stacked.

A wiring board 10A has the wiring structure 11A, a wiring structure 12A and a solder resist layer 13. The wiring structure 12A is stacked on an upper side of the wiring structure 11A. The solder resist layer 13 is stacked on a lower side of the wiring structure 11A.

In the wiring structure 11A, only an insulating layer 37 is stacked on an upper surface 20A of a core substrate 20. An insulating layer 47 and a wiring layer 48 are stacked on a lower surface 20B of the core substrate 20. For example, the insulating layers 37 and 47 may have the same thickness and made of the same type of thermosetting insulating resin.

Through holes 20Y are formed in the core substrate 20 and the insulating layers 37 and 47. The through holes 20Y penetrate through the core substrate 20 and the insulating layers 37 and 47 in the thickness direction. Through electrodes 21 are formed in the through holes 20Y. In the wiring structure 11A, each through hole 20Y is filled with the through electrode 21 but does not have a member corresponding to the resin 22 of the wiring structure 11. Upper end surfaces of the through electrodes 21 are exposed from the insulating layer 37. Also, the upper end surfaces of the through electrodes 21 are approximately flush with an upper surface of the insulating layer 37. Lower end surfaces of the through electrodes 21 are exposed from the insulating layer 47. The lower end surfaces of the through electrodes 21 are approximately flush with a lower surface of the insulating layer 47. The upper end surfaces of the through electrodes 21 are directly joined to a wiring layer 52 of a wiring structure 12A. The lower end surfaces of the through electrodes 21 are directly joined to the wiring layer 48.

The wiring structure 12A does not have a wiring layer 50. Instead, lower end surfaces of via wirings of the wiring layer 52 are directly joined to the upper end surfaces of the through electrodes 21. An insulating layer 51 is formed so as to cover the entire upper surface of the insulating layer 37. An opening portion 53Y is formed in an insulating layer 53. An upper surface of the insulating layer 51 near an outer periphery of the wiring structure 12A is exposed through the opening portion 53Y. An opening portion 55Y is formed in an insulating layer 55. The upper surface of the insulating layer 51 near the outer periphery of the wiring structure 12A is exposed through the opening portion 55Y. A cut-out portion 12Y is formed at the outer periphery of the wiring structure 12. Outer side surfaces of the insulating layers 53 and 55 and the upper surface of the insulating layer 51 constitute the cut-off portion 12Y.

The solder resist layer 13 is formed on a lower surface of the insulating layer 47 so as to cover the lowest wiring layer 48 of the wiring structure 11A. Opening portions 13X are formed in the solder resist layer 13. Portions of the lowest wiring layer 48 are exposed through the opening portions 13X so as to serve as external connection pads P2. A thickness of the solder resist layer 13 (i.e., a thickness from the lower surface of the insulating layer 47 to the lower surface of the solder resist layer 13) is equal to or larger than a thickness of the wiring structure 12A (i.e., a thickness from the upper surface of the insulating layer 37 to an upper surface of the insulating layer 55).

Although the wiring structure 11A does not have a stack structure in which multiple insulating layers and multiple wiring layers are stacked as described above, the wiring board 10A can provide the same advantages as the advantages (1) to (5) of the first exemplary embodiment.

Second Exemplary Embodiment

A second exemplary embodiment will be hereinafter described with reference to FIG. 20. A wiring board 10B according to the second exemplary embodiment is different from the wiring board 10 according to the first exemplary embodiment in that a wiring structure 11B replaces the wiring structure 11. Differences from the first exemplary embodiment will mainly be described below. Members that are the same as those shown in FIGS. 1 to 19 will be given the same reference symbols, and detailed descriptions thereon will be omitted.

Figure 20:
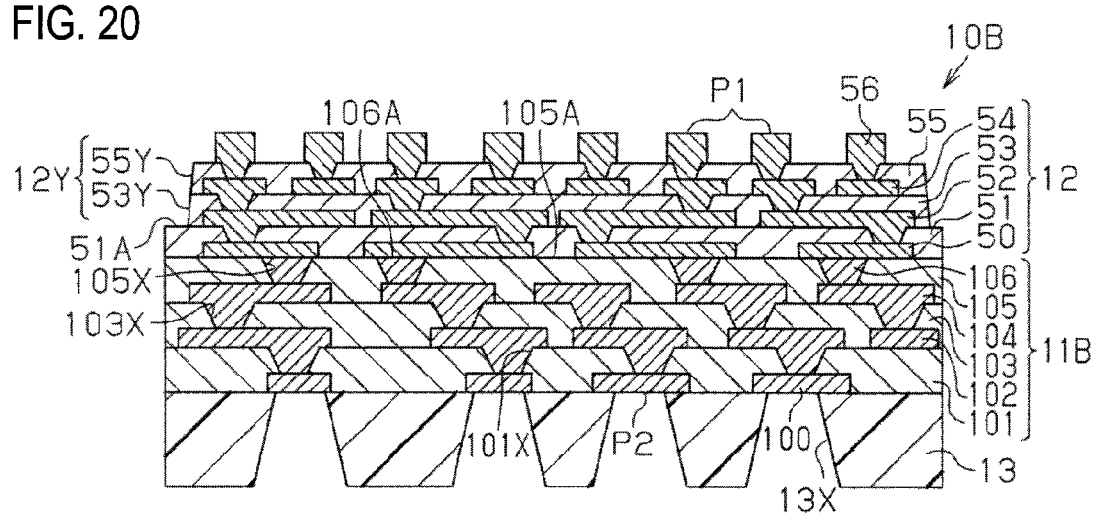
FIG. 20 is a schematic section view of a wiring board according to a second exemplary embodiment of the invention.

As shown in FIG. 20, the wiring structure 11B is a wiring structure which does not have a core substrate 20. The wiring structure 11B is a low-density wiring structure in which wiring layers are formed at lower densities than in a wiring structure 12. The wiring structure 11B is configured so that a wiring layer 100, an insulating layer 101, a wiring layer 102, an insulating layer 103, a wiring layer 104, an insulating layer 105, and via wirings 106 are stacked in this order. Examples of materials of the insulating layers 101, 103, and 105 include a thermosetting insulating resin containing, as a main component, an insulating resin such as an epoxy resin or a polyimide resin. The insulating layers 101, 103, and 105 may contain a filler made of silica, alumina, or the like. Examples of materials of the wiring layers 102 and 104 and the via wirings 106 include copper and a copper alloy. The insulating layers 101, 103, and 105 may have, for example, about 20 to 45 μm in thickness. The wiring layers 100, 102, and 104 may have, for example, about 15 to 35 μm in thickness. The wiring layers 100, 102, and 104 may have, for example, about 20 μm/20 μm in line/space (L/S).

The wiring layer 100 is the lowermost wiring layer of the wiring structure 11B. A lower surface of the wiring layer 100 is, for example, exposed from the insulating layer 101. For example, the lower surface of the wiring layer 100 is flush with a lower surface of the insulating layer 101. For example, the wiring layer 100 may have a stack structure including a first conductive layer (e.g., Cu layer) and a second conductive layer (e.g., Ni/Au layer). In this case, the wiring layer 100 is formed so that the Au layer is exposed from the insulating layer 101.

The insulating layer 101 is formed so as to cover an upper surface and side surfaces of the wiring layer 100. The lower surface of the wiring layer 100 is exposed from the insulating layer 101. Through holes 101X is formed at prescribed positions in the insulating layer 101. The through holes 101X penetrate through the insulating layer 101 in the thickness direction. Portions of the upper surface of the wiring layer 100 are exposed through the through holes 101X. Each through hole 101X is formed in a taper shape so that a diameter of each through hole 101X increases from a lower side (solder resist layer 13 side) to an upper side (wiring structure 12 side) in FIG. 20. For example, each through hole 101X has an inverted cone frustum shape so that an upper opening end of each through hole 101X has a larger diameter than a lower opening end thereof. The upper opening end of each through hole 101X may have, for example, about 60 to 70 μm in diameter.

The wiring layer 102 is stacked on an upper surface of the insulating layer 101. The wiring layer 102 electrically connects to the wiring layer 100. The wiring layer 102 has via wirings and a wiring pattern. The via wirings of the wiring layer 102 fill the through holes 101X. The wiring pattern of the wiring layer 102 is formed on the upper surface of the insulating layer 101.

The insulating layer 103 is formed on the upper surface of the insulating layer 101 so as to cover the wiring layer 102. Through holes 103X is formed at prescribed positions in the insulating layer 103. The through holes 103X penetrate through the insulating layer 103 in the thickness direction. Portions of an upper surface of the wiring layer 102 are exposed through the through holes 103X. Each through hole 103X is formed in a taper shape so that a diameter of each through hole 103X increases from the lower side to the upper side in FIG. 20. For example, each through hole 103X has an inverted cone frustum shape so that an upper opening end of each through hole 103X has a larger diameter than a lower opening end thereof. The upper opening end of each through hole 103X may have, for example, about 60 to 70 μm in diameter.

The wiring layer 104 is stacked on an upper surface of the insulating layer 103. The wiring layer 104 electrically connects to the wiring layer 102. The wiring layer 104 has via wirings and a wiring pattern. The via wirings of the wiring layer 104 fill the through holes 103X. The wiring pattern of the wiring layer 104 is formed on the upper surface of the insulating layer 103.

The insulating layer 105 is formed on the upper surface of the insulating layer 103 so as to cover the wiring layer 104. Through holes 105X are opens at prescribed positions on an upper surface of the insulating layer 105. The through holes 105X penetrate through the insulating layer 105 in the thickness direction. Portions of an upper surface of the wiring layer 104 are exposed through the through holes 105X. Each through hole 105X is formed in a taper shape so that a diameter of each through hole 105X increases from the lower side to the upper side in FIG. 20. For example, each through hole 105X has an inverted cone frustum shape so that an upper opening end of each through hole 105X has a larger diameter than a lower opening end thereof. The upper opening end of each through hole 105X may have, for example, about 60 to 70 µm in diameter.

Via wirings 106 are formed in the through holes 105X. The via wirings 106 electrically connect the wiring layer 104 to a wiring layer 50. The wiring layer 50 is formed on the upper surface of the insulating layer 105. The via wirings 106 penetrate through the insulating layer 105 in the thickness direction. Like the through holes 105X, each via wiring 106 is formed in a taper shape so that a diameter of each via wiring 106 increases from the lower side to the upper side in FIG. 20. For example, each via wiring 106 has an inverted cone frustum shape so that an upper end surface of each via wiring 106 has a larger diameter than a lower end surface thereof. The upper end surfaces 106A of the via wirings 106 are exposed from the insulating layer 105. Also, the upper end surfaces 106A of the via wirings 106 are directly connected to the wiring layer 50.

The solder resist layer 13 is formed on the lower surface of the insulating layer 101 so as to cover the lowest wiring layer 100 of the wiring structure 11B. Opening portions 13X are formed in the solder resist layer 13. Portions of the lowest wiring layer 100 are exposed through the opening portions 13X so as to serve as external connection pads P2. A thickness of the solder resist layer 13 (i.e., a thickness from the lower surface of the insulating layer 100 to the lower surface of the solder resist layer 13) is equal to or larger than a thickness of the wiring structure 12 (i.e., a thickness from the upper surface of the insulating layer 105 to an upper surface of an insulating layer 55).

Although the wiring structure 11B does not have a core substrate 20 as described above, the wiring board 10B can provide the same advantages as the advantages (1) to (5) of the first exemplary embodiment.

Other Exemplary Embodiments

Each of the above described exemplary embodiments may be modified as appropriate and practiced in various manners as described below.

In each of the above described exemplary embodiments and modifications, the pads P1 of the uppermost wiring layer 56 are larger in diameter than the via wirings which fill the through holes 55X. However, the structure of the uppermost wiring layer is not limited thereto.

Figure 21A:
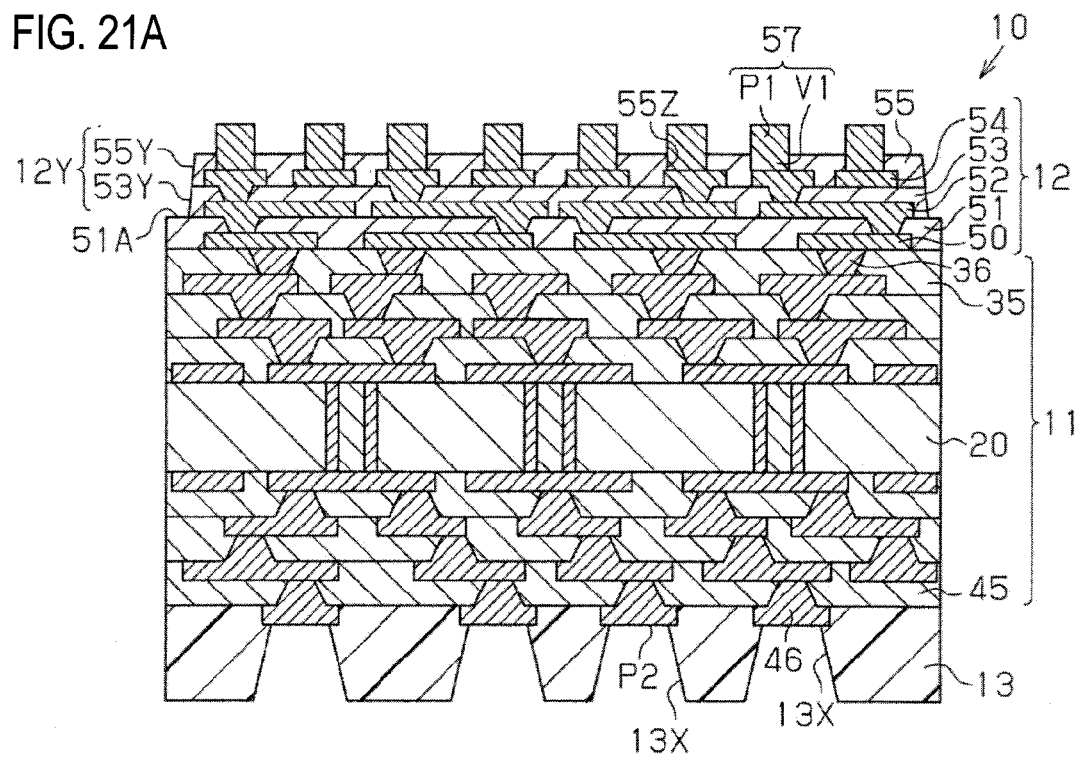
FIG. 21A is a schematic section view of a wiring board according to another modification example.
Figure 21B:
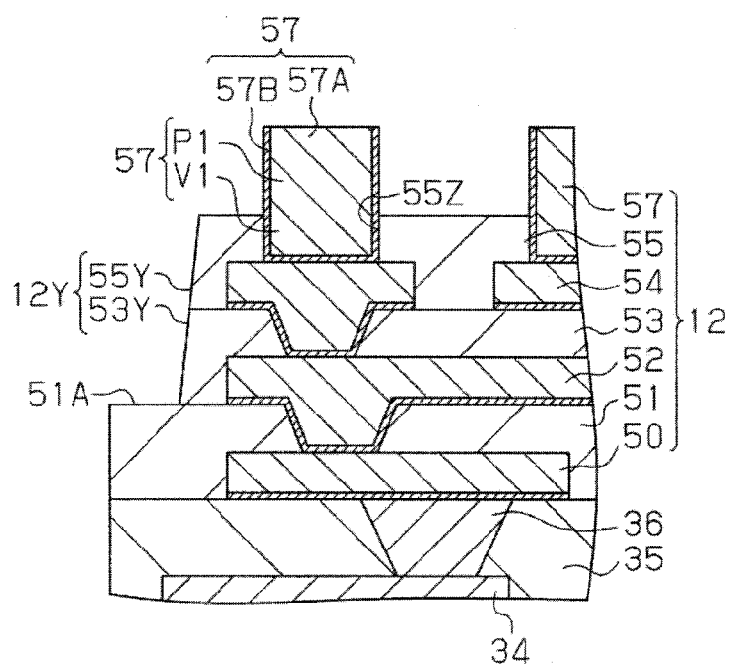
FIG. 21B is an enlarged section view of a part of FIG. 21A.

For example, as shown in FIGS. 21A and 21B, the wiring layer 56 may be replaced by a wiring layer 57. In the wiring layer 57, diameters of pads are equal to those of via wirings.

The wiring layer 57 has the via wirings V1 and the pads P1. The via wirings V1 fill through holes 55Z. The through holes 55Z penetrate through the insulating layer 55 in the thickness direction. Portions of the upper surface of the wiring layer 54 are exposed through h the through holes 55Z. The pads P1 project from the upper surface of the insulating layer 55. Each through hole 55Z has, for example, a cylindrical shape. An opening portion of each through hole 55Z may have, for example, about 20 to 30 µm in diameter.

The wiring layer 57 (via wirings V1 and pads P1) may have, for example, about 10 µm in thickness. The wiring layer 57 (via wirings V1 and pads P1) may be formed in a cylindrical shape having at about 20 to 30 µm in diameter. That is, the via wirings V1 and the pads P1 may have the same diameter of about 20 to 30 µm, for example. The pads P1 function as electronic component mounting pads for electrical connection to electronic components such as a semiconductor chip.

As shown in FIG. 21B, the wiring layer 57 has a metal layer 57A and a seed layer 57B. The metal layer 57A is formed, for example, in a cylindrical shape. The seed layer 57B is formed on portions, exposed to lower portions of the through holes 55Z, of the upper surface of the wiring layer 54. The seed layer 57B covers the entire lower surface and entire side surfaces of the cylindrical metal layer 57A. That is, the side surfaces of the via wiring portions (V1) of the metal layer 57A are covered with the seed layer 57B, and the side surfaces of the pad portions (P1) of the metal layer 57A are also covered with the seed layer 57B.

The metal layer 57A may be, for example, a Cu layer made of copper or a copper alloy. The seed layer 57B may be, for example, a seed layer having a two-layer structure in which a Ti layer and a Cu layer are stacked in this order on the portions, exposed to the lower portions of the through holes 55Z, of the upper surface of the wiring layer 54. Alternatively, the seed layer 57B may have a two-layer structure of a TiN layer and a Cu layer (i.e., the above Ti layer is replaced by the TiN layer).

The side surfaces of the pad portions (P1) of the metal layer 57A are covered with the seed layer 57B containing titanium or titanium nitride. Titanium and titanium nitride are metals that are higher in corrosion resistance than copper. Therefore, oxidation of the wiring layer 57 can be suppressed suitably.

Furthermore, a contact area between the wiring layer 57 and the underlying wiring layer 54 is larger than that between the wiring layer 56 (see FIG. 1) and the underlying wiring layer 54. Therefore, the reliability of the connection between the wiring layer 57 and the wiring layer 54 can be enhanced.

There are no particular limitations on the shape of the cut-out portion 12Y of each embodiment so long as the upper surface 51A of the insulating layer 51 near the outer periphery of the wiring structure 12 is exposed through the cut-out portion 12Y and is formed by (i) the upper surface 51A and (ii) the outer side surfaces of the insulating layers 53 and 55.

Figure 22:
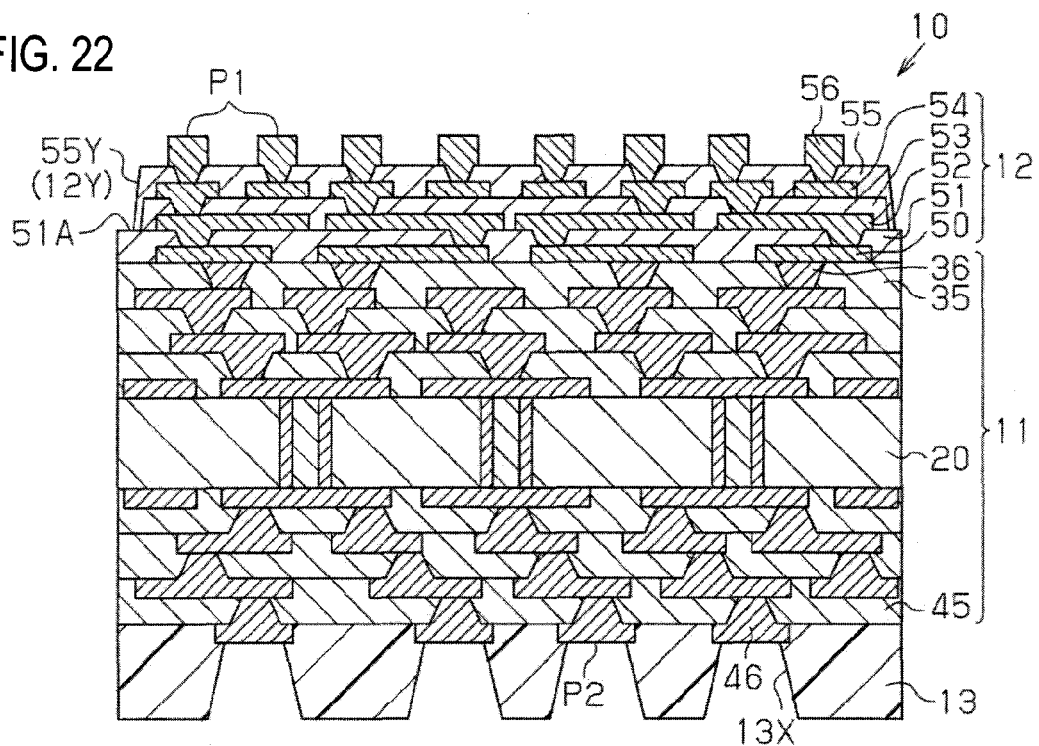
FIG. 22 is a schematic section view of a wiring board according to still another modification example.

For example, as shown in FIG. 22, the insulating layer 55 may be formed so as to cover the outer side surfaces of the insulating layer 53. In this case, an opening portion 55Y is formed in the insulating layer 55. The upper surface 51A of the insulating layer 51 near the outer periphery of the wiring structure 12 is exposed through the opening portion 55Y. That is, in this case, the cut-out portion 12Y is formed by (i) the portion, exposed through the opening portion 55Y, of the upper surface 51A of the insulating layer 51 and (ii) the outer side surfaces of the insulating layer 55.

Figure 23:
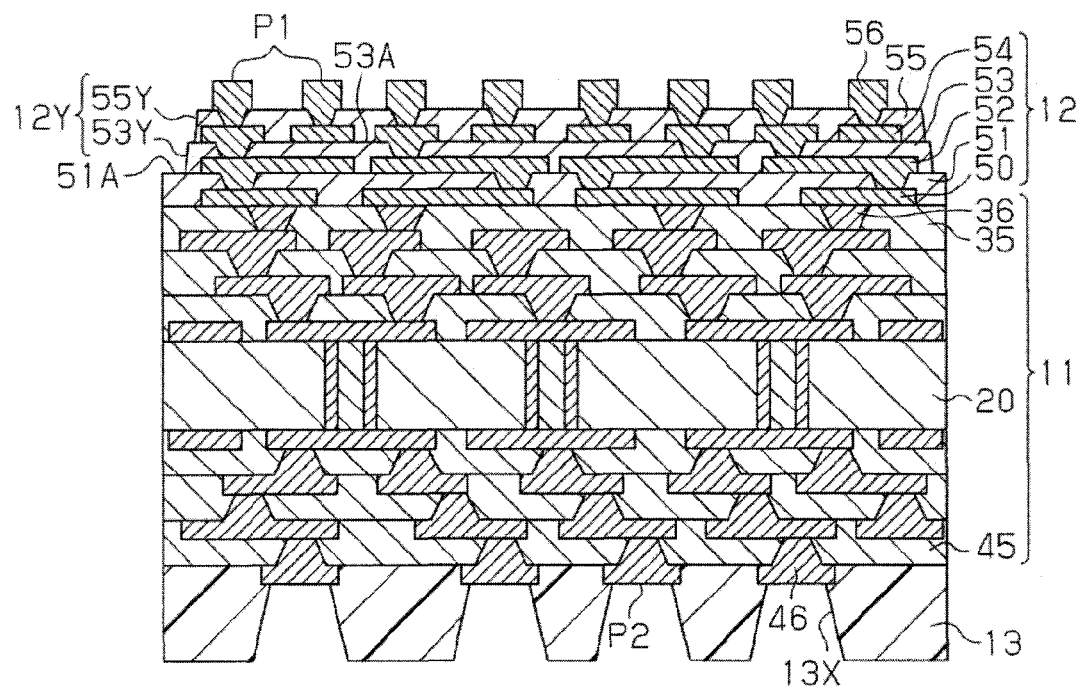
FIG. 23 is a schematic section view of a wiring board according to a further modification example.

Alternatively, an opening portion 55Y may be formed in the insulating layer 55 as shown in FIG. 23. Specifically, the upper surface 51A of the insulating layer 51 near the outer periphery of the wiring structure 12 is exposed through the opening portion 55Y and the upper surface 53A of the insulating layer 53 near the outer periphery of the wiring structure 12 is exposed through the opening portion 55Y. In this case, the cut-out portion 12Y is formed by (i) the portion, exposed through the opening portions 53Y and 55Y, of the upper surface 51A of the insulating layer 51, (ii) the outer side surfaces of the insulating layer 53, (iii) the portion, exposed through the opening portion 55Y, of the upper surface 53A of the insulating layer 53, and (iv) the outer side surfaces of the insulating layer 55. Furthermore, in the cut-out portion 12Y, a step is formed by (i) the outer side surfaces of the insulating layer 53, (ii) the portion, exposed through the opening portion 55Y, of the upper surface 53A of the insulating layer 53, and (iii) the outer side surfaces of the insulating layer 55.

In each of the above described exemplary embodiments and modifications, the thickness of the solder layer 13 is equal to or larger than the thickness of the wiring structure 12 or 12A. However, the invention is not limited thereto. For example, the thickness of the solder layer 13 may be smaller than the thickness of the wiring structure 12 or 12A.

There are no particular limitations on the sectional shapes of the through holes 31X, 33X, 35X, 41X, 43X, 45X, 51X, 53X, 101X, 103X, and 105X in the above described exemplary embodiments and modifications. For example, the through holes 31X, 33X, 35X, 41X, 43X, 45X, 51X, 53X, 101X, 103X, and 105X may have straight shapes, substantially rectangular shapes or the like in a section view.

The number of layers the wiring layers 50, 52, 54, 56, and 57 and the insulating layers 51, 53, and 55 of the wiring structures 12 and 12A in the above described exemplary embodiments and modifications may be modified or changed in various manners. Also, the manner of wiring of the wiring layers 50, 52, 54, 56, and 57 and the insulating layers 51, 53, and 55 of the wiring structures 12 and 12A in the above described exemplary embodiments and modifications may be modified or changed in various manners.

[Clauses]

This disclosure further encompasses various exemplary embodiments, for example, described below.

1. A method for manufacturing wiring boards, the method comprising:

forming a first insulating layer that contains a thermosetting resin as a main component;

forming a first wiring layer on an upper surface of the first insulating layer;

forming a second insulating layer containing a first photosensitive resin as a main component, so as to cover the first wiring layer and the entire upper surface of the first insulating layer;

forming a second wiring layer on an upper surface of the second insulating layer, the second wiring layer electrically connecting to the first wiring layer;

forming a third insulating layer on the upper surface of the second insulating layer, wherein the third insulating layer includes an opening portion and first through holes, the opening portion exposes the upper surface of the second insulating layer located in a cutting region and a region around the cutting region, the first through holes exposes an upper surface of the second wiring layer, and the third insulating layer contains the first photosensitive resin as a main component; and cutting the first insulating layer and the second insulating layer in the cutting region so as to obtain separated wiring boards.

2. The method according to the clause 1, further comprising:

after the forming of the first insulating layer and before the forming of the first wiring layer, forming second through holes penetrating through the first insulating layer in a thickness direction of the first insulating layer, forming a conductive layer that fills the second through holes and that covers the entire upper surface of the first insulating layer, and polishing the upper surface of the first insulating layer and the conductive layer projecting from the upper surface of the first insulating layer, so as to smooth the upper surface of the first insulating layer, form recess portions in the upper surface of the first insulating layer, and form via wirings having upper end surfaces that are exposed from the upper surface of the first insulating layer, wherein the first wiring layer connects to the upper end surfaces of the via wirings, and the second insulating layer fills the recess portions.

3. The method according to the clause 2, wherein in the polishing of the upper surface of the first insulating layer and the conductive layer, fillers exposed to the upper surface of the first insulating layer are removed to form the recess portions (35Y).

What is claimed is:

1. A wiring board, comprising:

a first insulating layer containing a thermosetting resin;

a first wiring layer stacked on an upper surface of the first insulating layer;

a second insulating layer stacked on the upper surface of the first insulating layer, the second insulating layer containing a first photosensitive resin;

a second wiring layer stacked on an upper surface of the second insulating layer, the second wiring layer electrically connecting to the first wiring layer; and a third insulating layer stacked on the upper surface of the second insulating layer, the third insulating layer containing the first photosensitive resin, wherein an outer side surface of the second insulating layer is flush with an outer side surface of the first insulating layer, an outer side surface of the third insulating layer is located inside the outer side surface of the second insulating layer in a plan view, and the upper surface of the second insulating layer connecting to the outer side surface of the second insulating layer is exposed from the third insulating layer.

2. The wiring board according to claim 1, wherein the first insulating layer further contains a filler, the upper surface of the first insulating layer is formed with a recess portion, and the second insulating layer fills the recess portion.

3. The wiring board according to claim 1, further comprising:

a first wiring structure;

a second wiring structure stacked on an upper surface side of the first wiring structure; and an outermost insulating layer stacked on a lower surface side of the first wiring structure, the outermost insulating layer containing a second photosensitive resin, wherein the first wiring structure includes the first insulating layer, at least one third wiring layer provided under a lower surface side of the second insulating layer, the at least one third wiring layers electrically connecting to the first wiring layer, at least one fourth insulating layer provided under a lower surface side of the first insulating layer, and an outermost wiring layer provided on the at least one fourth insulating layer, the outermost wiring layer electrically connecting to the at least one third wiring layer, the second wiring structure includes
the first wiring layer,
the second insulating layer,
the second wiring layer, and
the third insulating layer, the outermost insulating layer exposes at least a part of the outermost wiring layer, and a thickness of the outermost insulating layer is equal to or larger than a total sum of thicknesses of all insulating layers in the second wiring structure.

4. The wiring board according to claim 1, wherein the second wiring structure is higher in wiring density than the first wiring structure.

5. The wiring board according to claim 1, further comprising:
a through hole that opens on the upper surface of the first insulating layer and that penetrates through the first insulating layer in a thickness direction of the first insulating layer,
a via wiring that fills the through hole and that has an upper end surface exposed from the first insulating layer,
the upper end surface of the via wiring is flush with the upper surface of the first insulating layer, and
the first wiring layer connects to the upper end surface of the via wiring through a seed layer.

6. The wiring board according to claim 5, wherein the upper surface of the first insulating layer is lower in surface roughness than an inner surface of the through hole.

7. The wiring board according to claim 1, wherein the outer side surface of the third insulating layer is inclined.

8. The wiring board according to claim 1, further comprising:
a through hole that opens on the upper surface of the first insulating layer and that penetrates through the first insulating layer in a thickness direction of the first insulating layer; and
a via wiring that fills the through hole and that has an upper end surface exposed from the first insulating layer, wherein
the upper surface of the first insulating layer and the upper end surface of the via wiring are polished surfaces.

9. The wiring board according to claim 1, wherein the upper surface of the second insulating layer is smaller in surface roughness than the upper surface of the first insulating layer.

10. A semiconductor device, comprising:
the wiring board according to claim 3; and
a semiconductor chip that is flip-chip bonded to an outermost wiring layer of the second wiring structure.

* * * * *